(12) United States Patent
Noguchi et al.

(10) Patent No.: US 6,982,200 B2
(45) Date of Patent: Jan. 3, 2006

(54) SEMICONDUCTOR DEVICE MANUFACTURING METHOD

(75) Inventors: Junji Noguchi, Tokyo (JP); Toshinori Imai, Ome (JP); Tsuyoshi Fujiwara, Hamura (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/748,286

(22) Filed: Dec. 31, 2003

(65) Prior Publication Data

US 2004/0152256 A1 Aug. 5, 2004

(30) Foreign Application Priority Data

Jan. 8, 2003 (JP) ..................... P2003-002249

(51) Int. Cl.
*H01L 21/8242* (2006.01)

(52) U.S. Cl. ............... 438/253; 438/393; 438/638
(58) Field of Classification Search ........... 438/253, 438/393, 638, 672, 959, 288, 384, 239–241, 438/256, 396, 399; 257/306, 296
See application file for complete search history.

(56) References Cited

U.S. PATENT DOCUMENTS

| | | | | | |
|---|---|---|---|---|---|
| 5,436,062 | A | * | 7/1995 | Schmidt et al. | 428/209 |
| 6,080,664 | A | * | 6/2000 | Huang et al. | 438/638 |
| 6,130,449 | A | * | 10/2000 | Matsuoka et al. | 257/296 |
| 6,184,081 | B1 | * | 2/2001 | Jeng et al. | 438/253 |
| 6,479,341 | B1 | * | 11/2002 | Lu | 438/239 |
| 6,603,167 | B2 | * | 8/2003 | Hsue et al. | 257/301 |
| 6,630,705 | B2 | * | 10/2003 | Maeda et al. | 257/306 |
| 6,649,955 | B2 | * | 11/2003 | Lee | 257/295 |
| 6,709,918 | B1 | * | 3/2004 | Ng et al. | 438/253 |
| 6,713,847 | B1 | * | 3/2004 | Kobori | 257/637 |
| 2001/0020713 | A1 | | 9/2001 | Yoshitomi et al. | |
| 2002/0179955 | A1 | | 12/2002 | Miromoto et al. | |

FOREIGN PATENT DOCUMENTS

| | | |
|---|---|---|
| JP | 2002-9248 | 6/2000 |
| JP | 2001-237375 | 12/2000 |
| JP | 2003-51501 | 9/2001 |

* cited by examiner

*Primary Examiner*—Laura M Schillinger
(74) *Attorney, Agent, or Firm*—Reed Smith LLP; Stanley P. Fisher, Esq.; Juan Carlos A. Marquez, Esq.

(57) ABSTRACT

Disclosed is a method of manufacturing a semiconductor device which has reliable buried interconnects (wirings) and a reliable MIM capacitor. An interconnect and a capacitor bottom electrode are formed inside a hole made in six insulation films. Then a barrier insulation film is formed on the uppermost film (of the above six insulation films) including the interconnect and the top face of the bottom electrode. After two insulation films are formed above the barrier insulation film, a hole is made in the two insulation films and a capacitor top electrode is buried in that hole. The barrier insulation film also functions as a capacity insulation film for the capacitor. Then, after three other insulation films are formed on the upper film (of the above two insulation films) including the top face of the top electrode, a hole is made in the barrier insulation film, the two insulation films, and the three other insulation films, and another interconnect is buried in that hole.

10 Claims, 17 Drawing Sheets

SEMICONDUCTOR DEVICE MANUFACTURING METHOD

FIELD OF THE INVENTION

The present invention relates to semiconductor device manufacturing technology and more particularly to technology which is useful for the manufacture of a semiconductor device having a buried interconnect including a copper-based main conductor film, and an MIM (Metal Insulator Metal) capacitor.

BACKGROUND OF THE INVENTION

Between semiconductor device elements, there is for example, a circuit with a multilevel interconnection. With the growing tendency toward micro-fabrication, development of buried interconnect structures has been in progress. A buried interconnect structure is made as follows: a wiring material is buried, for example, into an interconnect hole such as a groove or hole made in an insulation film, using a damascene process (Single-Damascene technique and Dual-Damascene technique). For example, a copper film is deposited so as to fill a groove in the insulation film by electroplating and the copper film is polished by the CMP (Chemical Mechanical Polishing) method so that a buried interconnect is formed in the insulation film groove.

When a circuit requires a capacitor, an MIM capacitor is formed on an interlayer insulation film. JP-A No. 237375/2001 describes a technique based on a damascene process that the bottom electrode of an MIM capacitor is formed together with an underlying buried copper interconnect and its top electrode is formed together with an overlying buried copper interconnect (see Patent Literature 1).

Patent Literature 1: JP-A No. 237375/2001

In the process of forming the top electrode of an MIM capacitor together with an overlying buried copper interconnect, when the underlying buried copper interconnect is exposed at the bottom of a via (hole) for formation of the overlying buried copper interconnect (the insulation film on the underlying buried copper interconnect is removed), the insulation film on the bottom electrode must remain in place as a capacitor insulation film at the bottom of the hole for formation of the top electrode of the MIM capacitor. For this reason, it is necessary to make a photoresist mask pattern on a semiconductor substrate which covers the region for formation of the top electrode and exposes the region for formation of the overlying buried copper interconnect. In order to make such a photoresist mask pattern, an antireflective coating and a photoresist film must be made all over the surface of the semiconductor substrate before the photoresist film is patterned by photolithography. However, for patterning of the photoresist film, the antireflective coating buried in the via for formation of the overlying buried copper interconnect must be removed. The diameter of the via is relatively small and it is not easy to remove the antireflective coating buried in the via. If an excessive force should be applied to remove it, the side walls of the via could be etched, causing a deterioration in the reliability of the resulting buried interconnect and semiconductor device.

SUMMARY OF THE INVENTION

It is an object of the present invention to provide a method of manufacturing a semiconductor device with a reliable buried interconnect and a reliable MIM capacitor.

The above and further objects and novel features of the present invention will be apparent from the following detailed description taken in connection with the accompanying drawings.

A typical aspect of the present invention is briefly outlined as follows.

In a semiconductor device manufacturing method according to the present invention, after an underlying buried interconnect and the bottom electrode of a capacitor are formed by a damascene process, the capacitor top electrode is formed by a damascene process and then an overlying buried interconnect is formed by a damascene process. Thus it is possible to manufacture a semiconductor device with a reliable buried interconnect and a reliable capacitor.

BRIEF DESCRIPTION OF THE DRAWINGS

The invention will be more particularly described with reference to the accompanying drawings, in which.

DETAILED DESCRIPTION OF THE PREFERRED EMBODIMENTS

Figure 1:
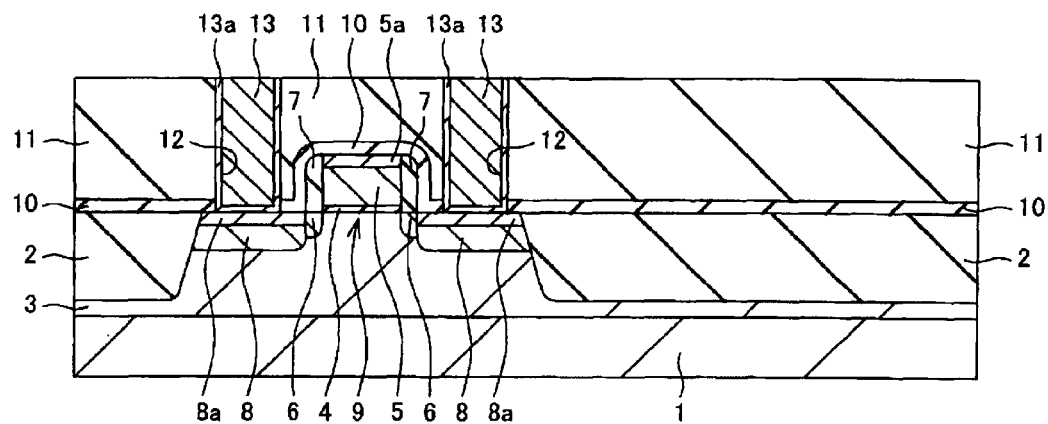
FIG. 1 is a sectional view showing the substantial part of a semiconductor device in a manufacturing step according to an embodiment of the present invention.

Preferred embodiments will be described below separately, but they are not irrelevant to each other unless otherwise specified. They are, in whole or in part, variations of each other and sometimes one description is a detailed or supplementary form of another.

In the preferred embodiments described below, even when a numerical figure (the number of pieces, numerical value, quantity, range, etc.) is indicated for an element, it is not limited to the indicated specific numerical figure unless otherwise specified or theoretically limited to the specific numerical figure; it may be larger or smaller than the specific numerical figure.

In the preferred embodiments described below, it is needles to say that their elements (including steps) are not necessarily essential unless otherwise specified or theoretically essential.

Similarly, in the preferred embodiments described below, when specific forms, positions or other factors are indicated for certain elements, forms, positions or other factors which are virtually equivalent or similar to the specific ones may be used unless otherwise specified or unless the specific ones should be used from a theoretical viewpoint. The same can be said of numerical values or ranges as mentioned above.

In all the accompanying drawings which illustrate the preferred embodiments, like reference numerals designate those with like functions and their descriptions are not repeated.

Among the drawings which illustrate the preferred embodiments, some top views have hatchings for better understanding.

Next, preferred embodiments of the invention will be described in detail, referring to the drawings.

(Embodiment 1)

A semiconductor device and a process of manufacturing it according to a first embodiment of the invention are described below. FIGS. 1 to 7 are sectional views showing the substantial part of a semiconductor device, for example, MISFET (Metal Insulator Semiconductor Field Effect Transistor), in the manufacturing process according to the first embodiment.

As shown in FIG. 1, a device isolation region 2 is formed, for example, on the main surface of a p-type monocrystalline silicon semiconductor substrate (semiconductor wafer) 1 with a resistivity of 1 to 10 ohm-cm or so. The device isolation region 2 is made of oxide silicon using the STI (Shallow Trench Isolation) method or LOCOS (Local Oxidization of Silicon) method.

Next, a p-type well 3 is formed in a region on the semiconductor substrate 1 where an n-channel MISFET is to be formed. The p-type well 3 is formed by ion implantation of impurities such as boron (B).

Then, a gate insulation film 4 is formed on the surface of the p-type well 3. The gate insulation film 4 is, for example, a thin oxide silicon film which is made, for example, by thermal oxidation.

Then, a gate electrode 5 is formed on the gate insulation film 4 on the p-type well 3. For example, the gate electrode 5 is formed as follows: a polycrystal silicon film is formed on the semiconductor substrate 1 and the polycrystal silicon film is made into a low resistivity n-type semiconductor film by phosphorous (P) ion implantation and patterned by dry etching.

Next, the areas at both sides of the gate electrode 5 on the p-type well 3 are made into $n^-$ type semiconductor regions 6 by ion implantation of impurities such as phosphorous.

Furthermore, spacers or side walls 7 which are made of, for example, oxide silicon are formed on the side walls of the gate electrode 5. The side walls 7 are made, for example, by depositing an oxide silicon film on the semiconductor substrate 1 and anisotropically etching the oxide silicon film.

After the formation of the side walls 7, $n^+$ type semiconductor regions 8 (source and drain) are formed, for example, by ion implantation of impurities such as phosphorous in areas at both sides of the gate electrode 5 on the p-type well 3 and the side walls 7. The impurity concentration of the $n^+$ type semiconductor regions 8 is higher than that of the $n^-$ type semiconductor regions 6.

Next, a silicide film 5a and a silicide film 8a are formed on the surfaces of the gate electrode 5 and each $n^+$ type semiconductor region 8 respectively by exposing the surfaces of the gate electrode 5 and the n$^+$ type semiconductor region 8 and depositing, for example, cobalt (Co) films and thermally treating the films. This decreases the diffusion resistance and contact resistance of the n$^+$ type semiconductor region 8. After that, the cobalt film areas which have not reacted are removed.

An n-channel MISFET (Metal Insulator Semiconductor Field Effect Transistor) 9 is thus formed on the p-type well 3.

Then, an insulation film 10 of silicon nitride and an insulation film 11 of silicon oxide are deposited on the semiconductor substrate 1 sequentially. Then, contact holes are made by dry-etching the insulation film 11 and insulation film 10 sequentially. The main surface of the semiconductor substrate 1, for example, the n$^+$ type semiconductor region 8 (silicide film 8a) or the gate electrode 5 (silicide film 5a) is partially exposed at the bottom of each contact hole 12.

Then, a plug 13 of tungsten (W) or another material is formed inside each contact hole 12. The procedure of making the plug 13 is as follows: for example, after a titanium nitride film 13a as a barrier film is formed on the insulation film 11 including the inside of the contact hole 12, a tungsten film is formed on the titanium nitride film 13a by CVD (Chemical Vapor Deposition) in a way to fill the contact hole 12 and unwanted tungsten film areas and titanium nitride film areas 13a are removed by CMP (Chemical Mechanical Polishing) or an etch back process.

Figure 2:
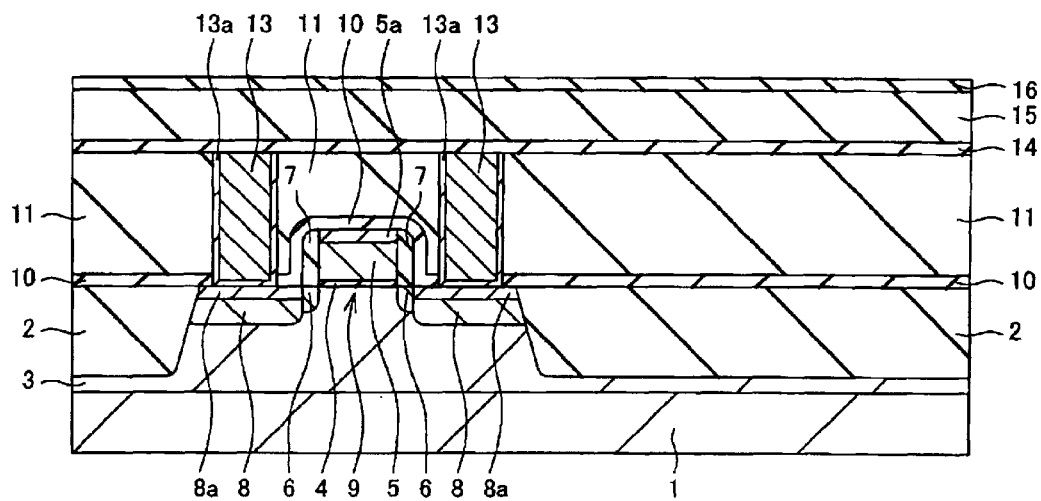
FIG. 2 is a sectional view showing the substantial part of the semiconductor device in a manufacturing step next to the step shown in FIG. 1.

Next, as shown in FIG. 2, an insulation film (etching stopper film) 14 is formed on the insulation film 11 in which the plugs 13 are buried. The insulation film 14 is made of silicon nitride or silicon carbide (SiC). The insulation film 14 is provided so that in the process of making a groove or hole for formation of an interconnect in an overlying insulation film (interlayer insulation film 15 above it) by etching, an underlying layer may not be damaged or dimensional accuracy may not be deteriorated by etching the insulation film 15 excessively or inadequately. In other words, the insulation film 14 functions as an etching stopper in etching the insulation (interlayer insulation) film 15.

Subsequently, the insulation film (interlayer insulation) film 15 is formed on the insulation film 14. It is desirable that the insulation film 15 be made of a material with a low dielectric constant (low-k insulation film or low-k material) such as organic polymer or organic silica glass. Here, an insulation film with a low dielectric constant (low-k insulation film) is exemplified by an insulation film whose dielectric constant is lower than that of a silicon oxide film (for example, TEOS (tetraethoxysilane) oxide film) included in a passivation film. Generally, a low-k insulation film refers to an insulation film whose dielectric constant is lower than the specific dielectric constant of a TEOS oxide film ($\epsilon$=4.1–4.2 or so).

Organic polymers as low-k materials include: SiLK (made by The Dow Chemical Co. of the U.S.A.; specific dielectric constant=2.7; heat resistance=490 degrees Celsius or more; dielectric breakdown withstand voltage=4.0 to 5.0 MV/Vm) and FLARE (made by Honeywell Electronic Materials of the U.S.A.; specific dielectric constant=2.8; heat resistance=400 degrees Celsius or more) as a polyarylether (PAE) material. This PAE material has high basic performance, namely features excellent mechanical strength and thermal stability, and low cost. Organic silica glass (SiOC material) as low-k materials include HSG-R7 ((made by Hitachi Chemical Co. Ltd.; specific dielectric constant= 2.8; heat resistance=650 degrees Celsius), Black Diamond (Applied Materials Inc. of the U.S.A.; specific dielectric constant=3.0 to 2.4; heat resistance=450 degrees Celsius) and p-MTES (made by Hitachi Kaihatsu; specific dielectric constant=3.2). Other SiOC materials include CORAL (made by Novellus Systems, Inc of the U.S.A.; specific dielectric constant=2.7 to 2.4; heat resistance=500 degrees Celsius), and Aurora 2.7 (made by ASM Japan K.K.; specific dielectric constant=2.7; heat resistance=450 degrees Celsius).

Also, the low-k material may be an FSG (SiOF) material, HSQ (hydrogen silsesquioxane) material, MSQ (methyl silsesquioxane) material, porous HSQ material, porous MSQ material or porous organic material. The HSQ materials include OCD T-12 (made by Tokyo Ohka Kogyo Co., Ltd.; specific dielectric constant=3.4 to 2.9; heat resistance= 450 degrees Celsius), FOx ((made by Dow Corning Corp. of the U.S.A.; specific dielectric constant=2.9), and OCL T-32 (made by Tokyo Ohka Kogyo Co., Ltd.; specific dielectric constant=2.5; heat resistance=450 degrees Celsius). The MSQ materials include OCD T-9 (made by Tokyo Ohka Kogyo Co., Ltd.; specific dielectric constant=2.7; heat resistance=600 degrees Celsius), LKD-T200 (made by JSR; specific dielectric constant=2.7 to 2.5; heat resistance=450 degrees Celsius), HOSP ((made by Honeywell Electronic Materials of the U.S.A.; specific dielectric constant 2.5; heat resistance=550 degrees Celsius), HSG-RZ25 (made by Hitachi Chemical Co., Ltd.; specific dielectric constant=2.5; heat resistance=650 degrees Celsius), OCL T-31 (made by Tokyo Ohka Kogyo Co., Ltd.; specific dielectric constant=2.3; heat resistance=500 degrees Celsius), and LKD-T400 (made by JSR; specific dielectric constant=2.2 to 2; heat resistance= 450 degrees Celsius). The porous HSQ materials include XLK (made by Dow Corning Corp. of the U.S.A.; specific dielectric constant=2.5 to 2), OCL T-72 (made by Tokyo Ohka Kogyo Co., Ltd.; specific dielectric constant=2.2 to 1.9; heat resistance=450 degrees Celsius), Nanoglass ((made by Honeywell Electronic Materials of the U.S.A.; specific dielectric constant=2.2 to 1.8; heat resistance=500 degrees Celsius or more), and MesoELK (made by Air Products and Chemicals, Inc. of the U.S.A.; specific dielectric constant= 2.7 or less).

The porous MSQ materials include HSG-6211X ((made by Hitachi Chemical Co., Ltd.; specific dielectric constant= 2.4; heat resistance=450 degrees Celsius), ALCAP-S (made by Asahi Kasei Corporation; specific dielectric constant=2.3 to 1.8; heat resistance=450 degrees Celsius), OCL T-77 (made by Tokyo Ohka Kogyo Co., Ltd.; specific dielectric constant=2.2 to 1.9; heat resistance=600 degrees Celsius), HSG-6210X (made by Hitachi Chemical Co., Ltd.; specific dielectric constant=2.1; heat resistance=650 degrees Celsius), and silica aerogel (made by Kobe Steel Ltd.; specific dielectric constant=1.4 to 1.1). The porous organic materials include PolyELK (made by Air Products and Chemicals, Inc. of the U.S.A.; specific dielectric constant=2 or less; heat resistance=490 degrees Celsius). The SiOC and SiOF materials are prepared by CVD. For example, Black Diamond is prepared by CVD using a mixed gas of trimethylsilane and oxygen. p=MTES is prepared by CVD using a mixed gas of methyltriethoxysilane and N$_2$O. Other low-k insulation materials are prepared by a coating technique.

An insulation film 16 is formed on the insulation film 15 thus made of any of the abovementioned low-k materials by CVD or a similar technique. The insulation film 16 is made of silicon oxide (SiO$_x$), typically silicon dioxide (SiO$_2$). Another material for the insulation film 16 is silicon oxynitride (SiON). The insulation film 16 maintains the mechanical strength of the insulation film 15, protects its surface and guarantees its moisture resistance during a CMP process. If the insulation film 15 is made of silicon oxide (SiOF)

containing fluorine (F), the insulation film 16 prevents diffusion of the fluorine in the insulation film 15.

If the insulation film 15 is made of a material which could be damaged by oxygen plasma, such as an organic polymer material (for example, SiLK) or a porous organic material (for example, PolyELK), a thin insulation film (not shown), like a silicon nitride ($Si_xN_y$) film, a silicon carbide (SiC) film, or a silicon carbonitride (SiCN) film, may be formed on the insulation film 15 without using oxidizing plasma such as oxygen ($O_2$) plasma and an insulation film 16 may be formed on the thin insulation film. This will improve the degree of adhesion between the insulation film 15 and the insulation film 16. It is also possible to use an insulation film made of silicon nitride ($Si_xN_y$), silicon carbide (SiC) or silicon carbonitride (SiCN) as the insulation film 16.

Figure 3:
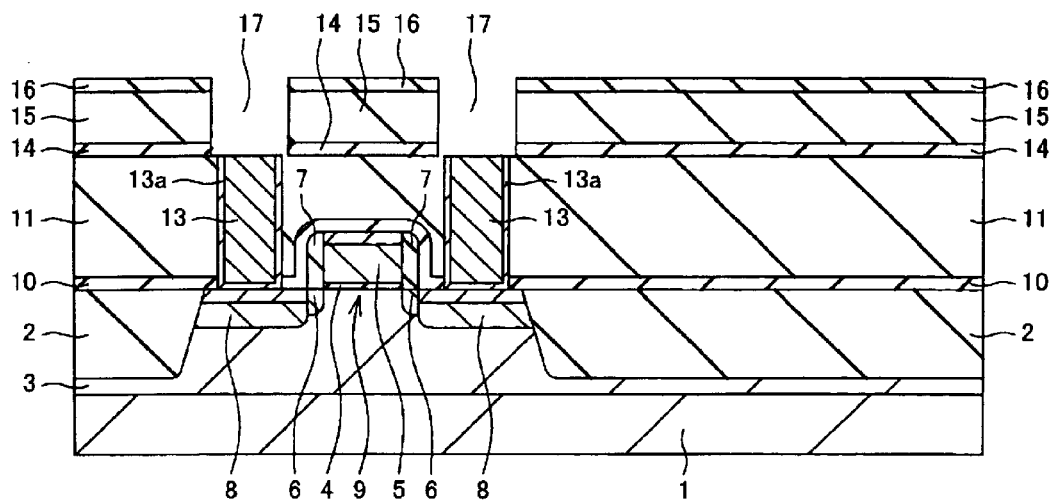
FIG. 3 is a sectional view showing the substantial part of the semiconductor device in a manufacturing step next to the step shown in FIG. 2.

Next, as illustrated in FIG. 3, holes (holes or grooves for interconnects) are made by removing selected areas of the insulation films 14, 15, and 16 using a photolithographic process and a dry etching process. The top face of the plug 13 is exposed at the bottom of each hole 17. After this, the photoresist pattern used as an etching mask (not shown) (and the antireflective coating) is removed by ashing or a similar technique. If the insulation film 15 is made of a material which could be damaged by oxygen plasma, such as an organic polymer material (for example, SiLK) or a porous organic material (for example, PolyELK) the insulation film 15 may be etched by reducing plasma treatment such as $NH_3$ plasma treatment or $N_2/H_2$ plasma treatment and the photoresist pattern (and the antireflective coating) may be removed by ashing.

Figure 4:
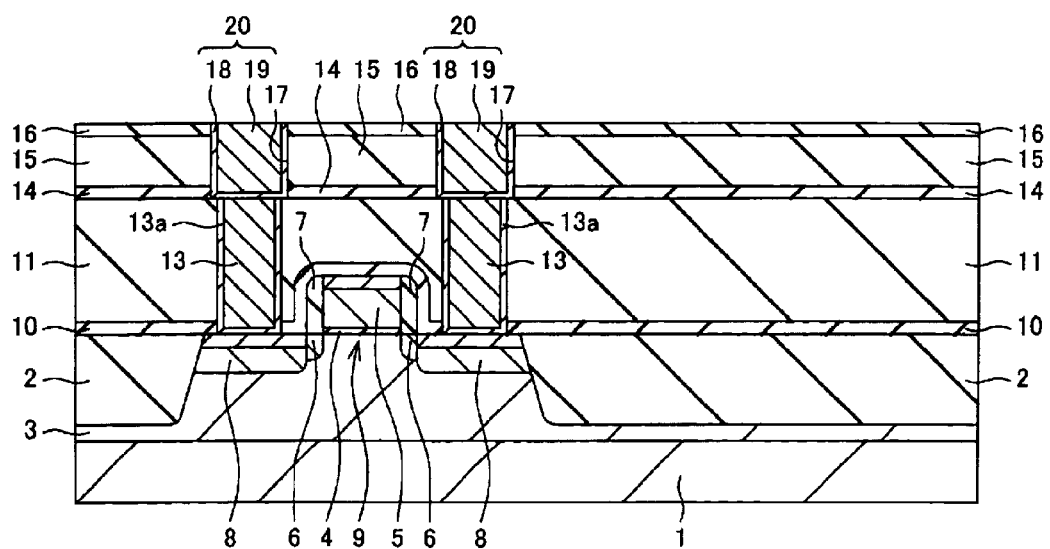
FIG. 4 is a sectional view showing the substantial part of the semiconductor device in a manufacturing step next to the step shown in FIG. 3.

As illustrated in FIG. 4, a relatively thin conductive barrier film 18 with a thickness of 50 nm or so, made of, for example, titanium nitride (TiN) is formed all over the main surface of the semiconductor substrate 1 (namely on the insulation film 16 including the bottoms and side walls of the holes 17). Sputtering or CVD may be used to form the conductive barrier film 18. The conductive barrier film 18 has a function to suppress or prevent diffusion of copper for formation of a main conductor film (stated later) and also a function to improve the wettability of copper in a reflow process for the main conductor film. As a material for the conductive barrier film 18, high-melting point metal nitride such as tungsten nitride (WN) which hardly reacts with copper, or tantalum nitride (TaN) may be used instead of titanium nitride. Alternatively, high-melting point metal nitride with added silicon (Si) or high-melting point metal which hardly reacts with copper, such as tantalum (Ta), titanium (Ti), tungsten (W), or titanium tungsten alloy may be used as a material for the conductive barrier film 18. Also, the conductive barrier film 18 may be either a single-layer film or a laminated film.

Next, a main conductor film 19 made of copper which is relatively thick (800 to 1600 nm) is formed on the conductive barrier film 18. The CVD, sputtering or electroplating technique may be used for formation of the main conductor film 19. The main conductor film 19 may be made of a copper-based conductor such as copper or copper alloy (containing Mg, Ag, Pd, Ti, Ta, Al, Nb, Zr or Zn). An alternative method of forming the main conductor film 19 is to make a relatively thin copper (or copper alloy) shield film by sputtering or a similar technique and make a relatively thick film of copper (or copper alloy) as the main conductor film 19 by electroplating. Then, the semiconductor substrate 1 is heat-treated in a non-oxidative atmosphere (for example, a hydrogen atmosphere) of 475 degrees Celsius or so to perform a reflow process for the main conductor film 19 to fill the hole 17 with copper.

Then, the main conductor film 19 and the conductive barrier film 18 are polished, for example, by a CMP process until the top face of the insulation film 16 is exposed. Unwanted areas of the conductive barrier film 18 and main conductor film 19 on the insulation film 16 are thus removed, leaving some of the conductive barrier film 18 and main conductor film 19 inside the hole 17. As a consequence, an interconnect (first interconnect layer) 20 which consists of a relatively thin conductive barrier film 18 and a relatively thick main conductor film 19 is formed inside the hole 17, as illustrated in FIG. 4. The interconnect thus formed 20 is electrically connected through the plug 13 to the $n^+$ type semiconductor regions (source and drain) 8 and to the gate electrode 5. Alternatively, unwanted areas of the conductive barrier film 18 and main conductor film 19 may be removed by etching (electrolytic etching, etc.).

After this, for ammonia ($NH_3$) plasma treatment of the semiconductor substrate 1 (particularly the polished surface where the interconnect 20 is exposed), the semiconductor substrate 1 is placed in a room for treatment by plasma CVD equipment and ammonia gas is introduced therein to turn on the plasma power supply. Alternatively, $N_2$ gas and $H_2$ gas may be introduced for $N_2/H_2$ plasma treatment. Reducing plasma treatment like this reduces the copper oxide (CuO, $Cu_2O$, $CuO_2$) on the copper interconnect surface as oxidized by CMP to copper and forms a copper nitride (CuN) layer on the surface (very thin area) of the interconnect 20.

Figure 5:
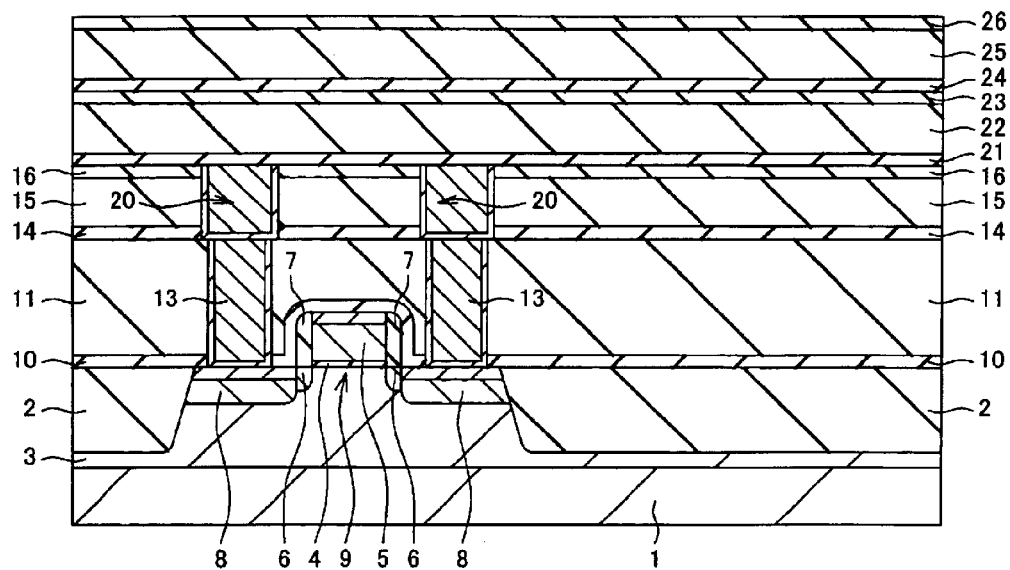
FIG. 5 is a sectional view showing the substantial part of the semiconductor device in a manufacturing step next to the step shown in FIG. 4.

Then, after cleaning is done as necessary, an insulation film (barrier insulation film) 21 is formed all over the main surface of the semiconductor substrate 1 by plasma CVD, as illustrated in FIG. 5. In other words, the insulation film 21 is formed on the insulation film 16 including the top face of the interconnect 20. The insulation film 21 functions as a barrier insulation film for the copper interconnect. Therefore, the insulation film 21 suppresses or prevents diffusion of copper in the main conductor film 19 of the interconnect 20 in an insulation film 22 which will be formed later. The insulation film 21 is made, for example, of silicon nitride. Other materials for the insulation film 21 include silicon carbide (SiC), silicon carbonitride (SiCN), silicon oxynitride (SiON) and silicon oxycarbide (SiOC).

Next, insulation films 22, 23, 24, 25, and 26 are formed over the insulation film 21 sequentially. The insulation film (interlayer insulation film) 22 may be made of the same material as the insulation film 15 (material with a low dielectric constant). The insulation film 23 may be made of the same material as the insulation film 16. The insulation film 23 may be omitted if it is not needed. The insulation film (etching stopper film) 24 may be made of the same material as the insulation film 14 or insulation film 21. The insulation film (interlayer insulation film) 25 may be made of the same material as the insulation film 15 (material with a low dielectric constant). The insulation film 26 may be made of the same material as the insulation film 16.

Figure 6:
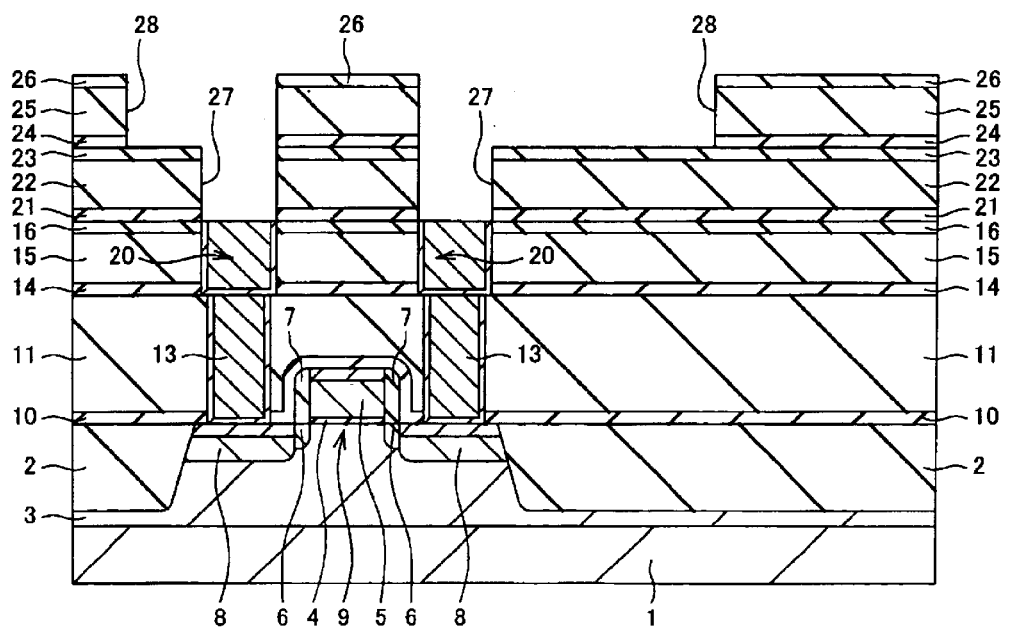
FIG. 6 is a sectional view showing the substantial part of the semiconductor device in a manufacturing step next to the step shown in FIG. 5.

Next, as illustrated in FIG. 6, photolithography and dry etching are used to etch the insulation films 21 to 26 in order to make interconnect holes, namely via holes 27 which reach the interconnect 20 and holes (interconnect grooves) 28. The holes 28 are formed by removing selected areas of the insulation films 24 to 26. The holes 27 are formed by removing selected areas of the insulation films 21 to 23 at the bottom of the holes 28. The top face of the interconnect 20 is exposed at the bottom of each hole 27.

Then, the copper oxide on the surface of the interconnect 20 (underlying copper interconnect layer) exposed at the bottom of the hole 27 is removed to clean the exposed top face of the interconnect 20. This cleaning process is achieved by reducing the copper oxide (CuO, $Cu_2O$, $CuO_2$) on the copper interconnect surface to copper (Cu) by reducing plasma treatment such as hydrogen ($H_2$) plasma treatment.

Figure 7:
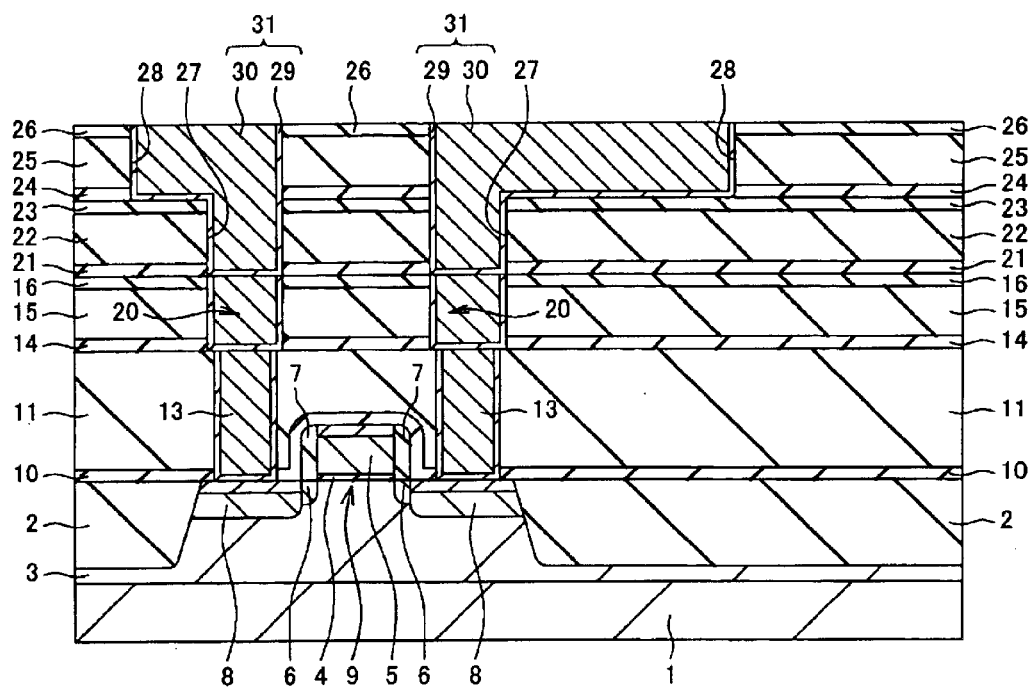
FIG. 7 is a sectional view showing the substantial part of the semiconductor device in a manufacturing step next to the step shown in FIG. 6.
Figure 8:
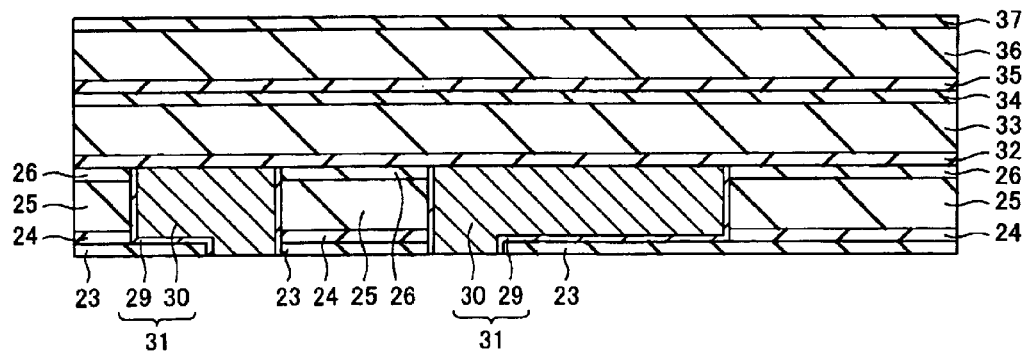
FIG. 8 is a sectional view showing the substantial part of the semiconductor device in a manufacturing step next to the step shown in FIG. 7.

Then, as illustrated in FIG. 7, a conductive barrier film 29 of the same material as the conductive barrier film 18 is formed on the insulation film 26 including the bottom and side faces of the holes 27 and 28 in a similar way. Then, a main conductor film 30 of the same material as the main conductor film 19 is formed on the conductive barrier film 29 in a similar way so as to fill the holes 27 and 28. The main conductor film 30 and the conductive barrier film 29 are polished, for example, by a CMP process until the top face of the insulation film 26 is exposed. Unwanted areas of the conductive barrier film 29 and main conductor film 30 on the insulation film 26 are thus removed, leaving some of the conductive barrier film 29 and main conductor film 30 inside the holes 27 and 28. As a consequence, an interconnect (second interconnect layer) 31 which consists of a relatively thin conductive barrier film 29 and a relatively thick main conductor film 30 is formed inside the holes 27 and 28, as illustrated in FIG. 7. The interconnect area composed of the conductive barrier film 29 and main conductor film 30 buried in the hole 28 is electrically connected through a via hole composed of the conductive barrier film 29 and main conductor film 30 buried in the hole 27 to the interconnect 20 (underlying interconnect layer).

Figure 11:
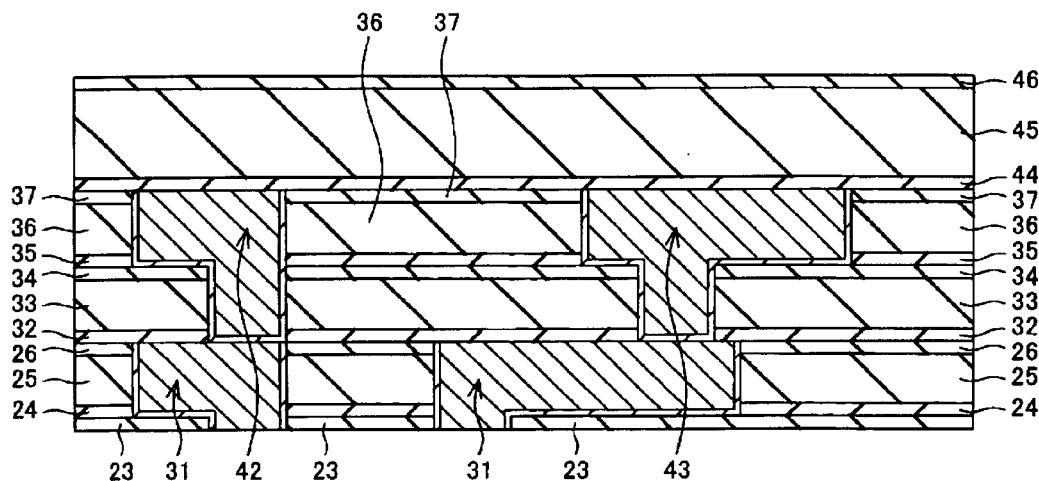
FIG. 11 is a sectional view showing the substantial part of the semiconductor device in a manufacturing step next to the step shown in FIG. 10.
Figure 12:
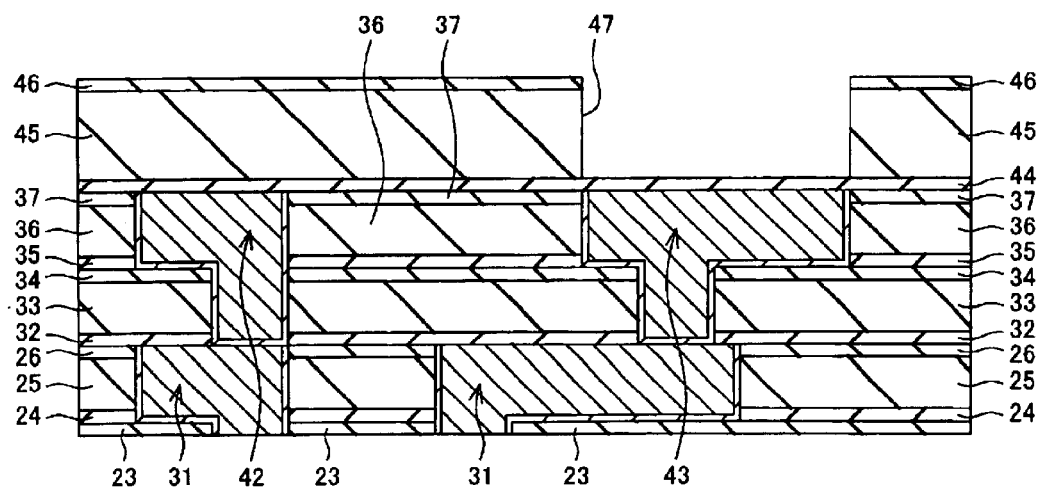
FIG. 12 is a sectional view showing the substantial part of the semiconductor device in a manufacturing step next to the step shown in FIG. 11.
Figure 13:
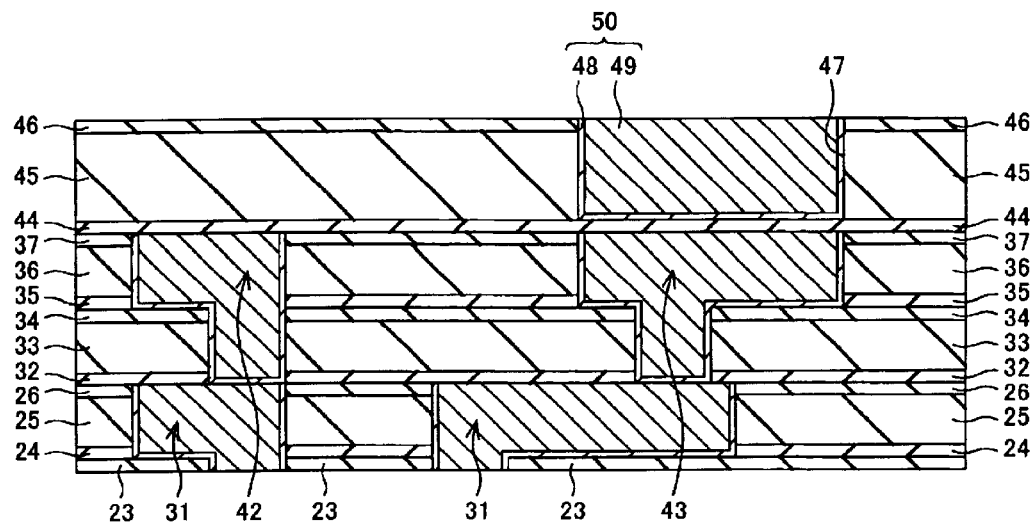
FIG. 13 is a sectional view showing the substantial part of the semiconductor device in a manufacturing step next to the step shown in FIG. 12.
Figure 14:
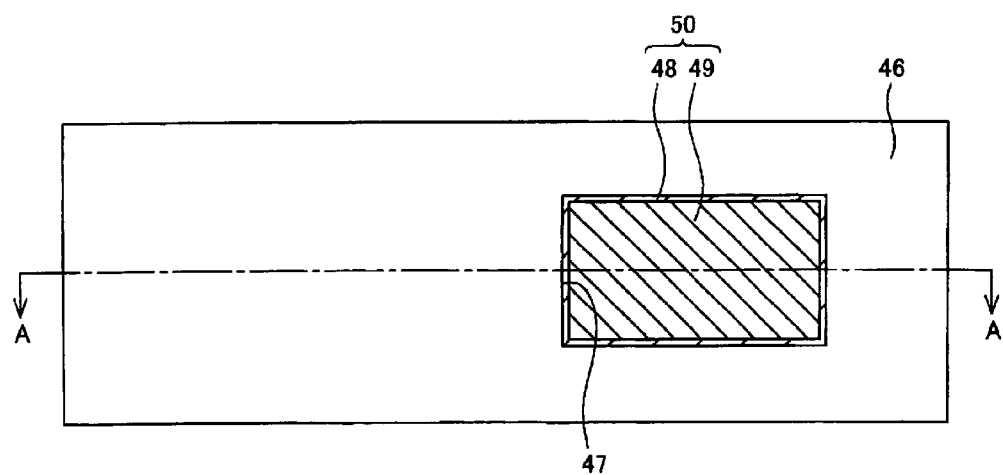
FIG. 14 is a top view showing the substantial part of the semiconductor device shown in FIG. 13.
Figure 15:
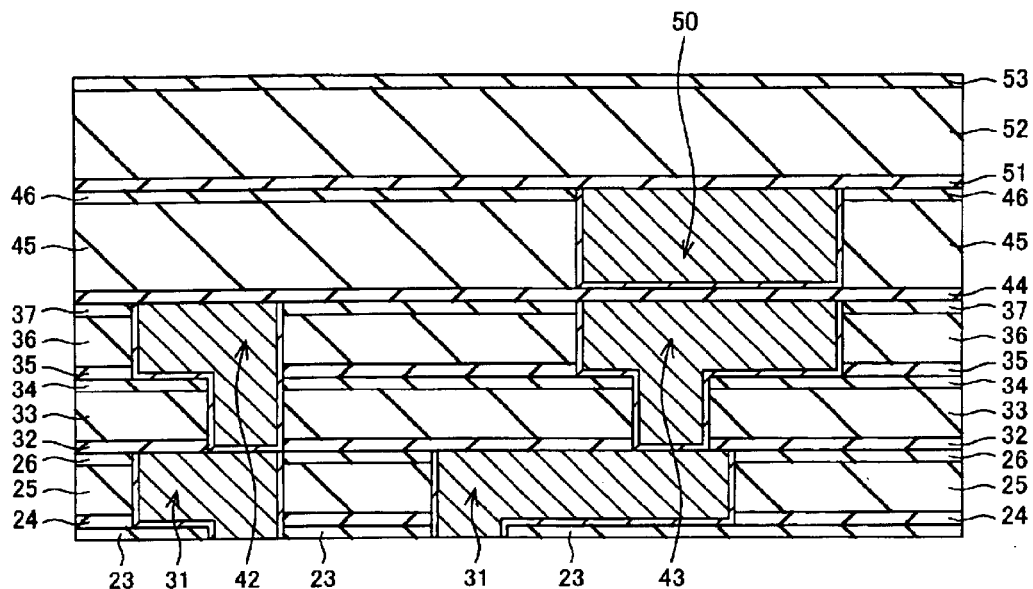
FIG. 15 is a sectional view showing the substantial part of the semiconductor device in a manufacturing step next to the step shown in FIG. 13.
Figure 16:
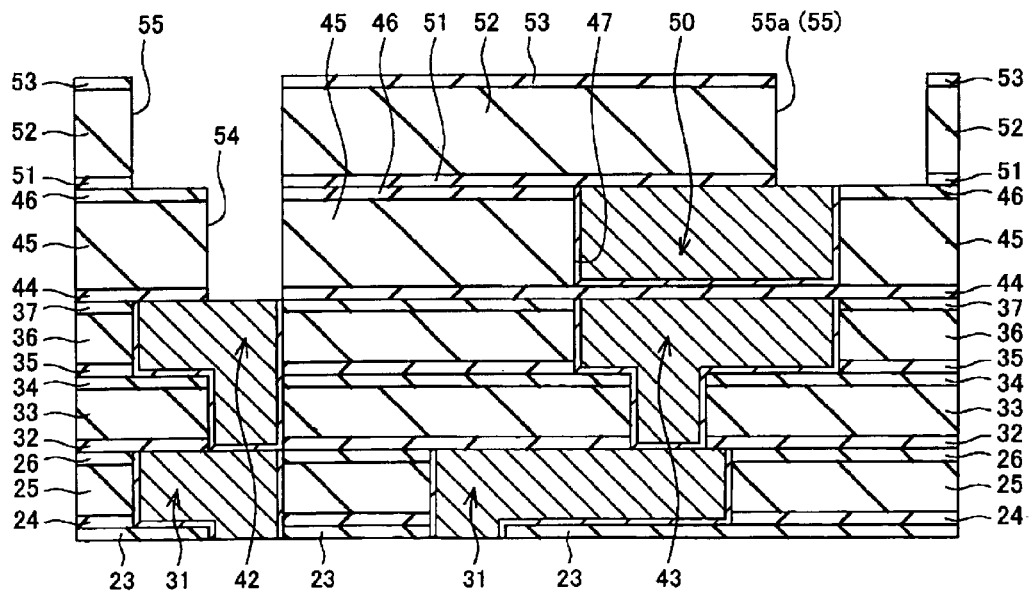
FIG. 16 is a sectional view showing the substantial part of the semiconductor device in a manufacturing step next to the step shown in FIG. 15.
Figure 17:
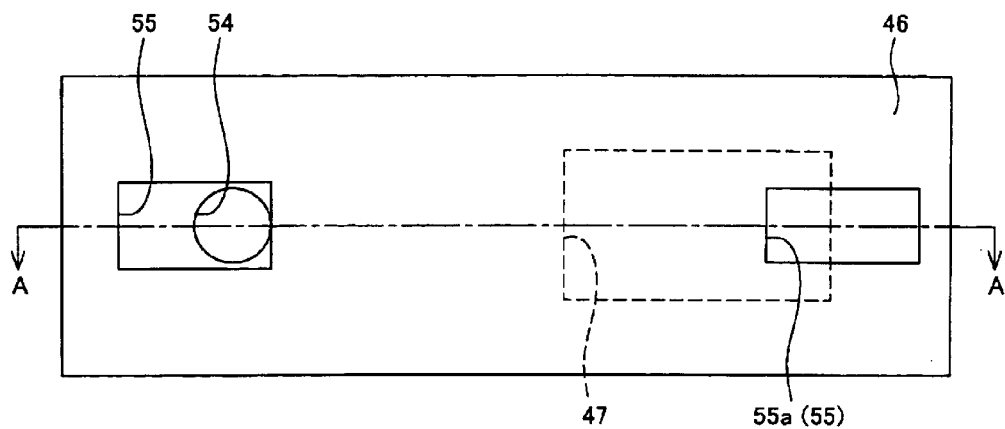
FIG. 17 is a top view showing the substantial part of the semiconductor device shown in FIG. 16.
Figure 18:
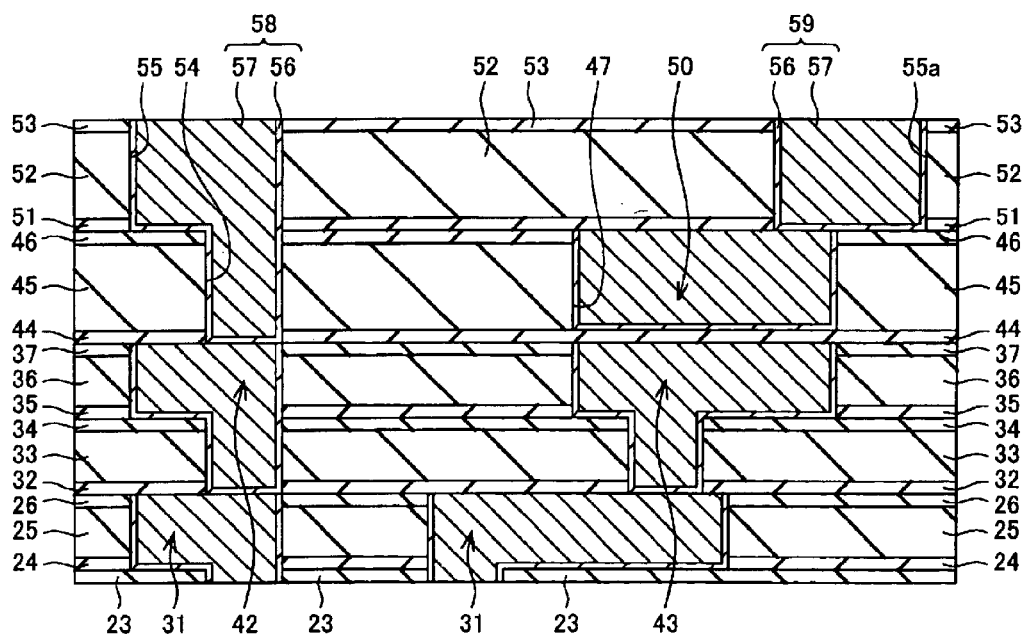
FIG. 18 is a sectional view showing the substantial part of the semiconductor device in a manufacturing step next to the step shown in FIG. 16.
Figure 19:
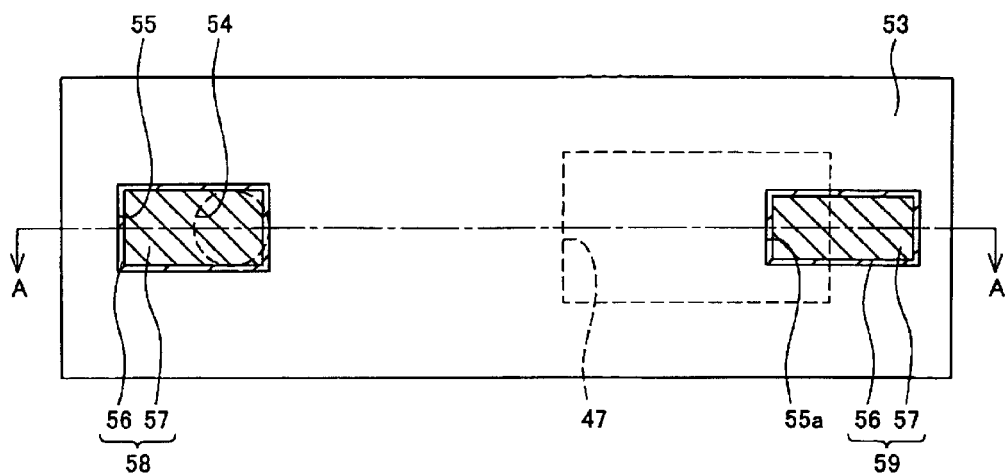
FIG. 19 is a top view showing the substantial part of the semiconductor device shown in FIG. 18.

FIGS. 8 to 19 are sectional or top views respectively showing the substantial part of the semiconductor device which is in various manufacturing steps subsequent to the step shown in FIG. 7. FIGS. 14, 17, and 19 respectively show those shown in FIGS. 13, 16, and 18 as viewed from top. FIGS. 13, 16, and 18 are sectional views taken along the line A—A of FIGS. 14, 17, and 19, respectively. Among FIGS. 8 to 19, the figures other than FIGS. 14, 17, and 19 are sectional views. For simpler illustration and better understanding, the structural part located below the insulation film 23 shown in FIG. 7 is not shown in these sectional views.

Figure 9:
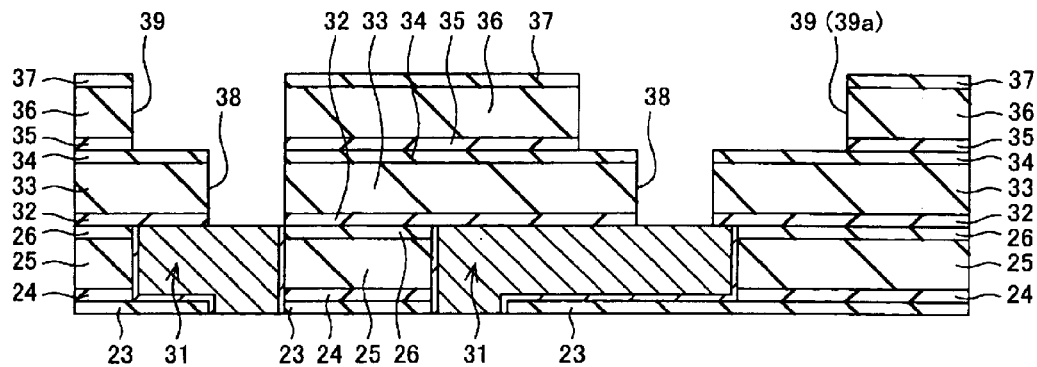
FIG. 9 is a sectional view showing the substantial part of the semiconductor device in a manufacturing step next to the step shown in FIG. 8.

After the structure shown in FIG. 7 is obtained as mentioned above, as illustrated in FIG. 8, insulation films 32 to 37 are formed sequentially all over the main surface of the semiconductor substrate 1, namely on the insulation film 26 including the top face of the interconnect 31, using the same materials and the same processes as for the insulation films 21 to 26. Then, as illustrated in FIG. 9, holes (via holes) 38 and holes (interconnect grooves) 39 are made in the same manner as for the holes 27 and 28. The holes 39 are made by removing selected areas of the insulation films 35 to 37 and the holes 38 are made by removing selected areas of the insulation films 32 to 34 in the bottom of the holes 39. The top-face of the interconnect 31 is exposed at the bottom of the hole 38.

Figure 10:
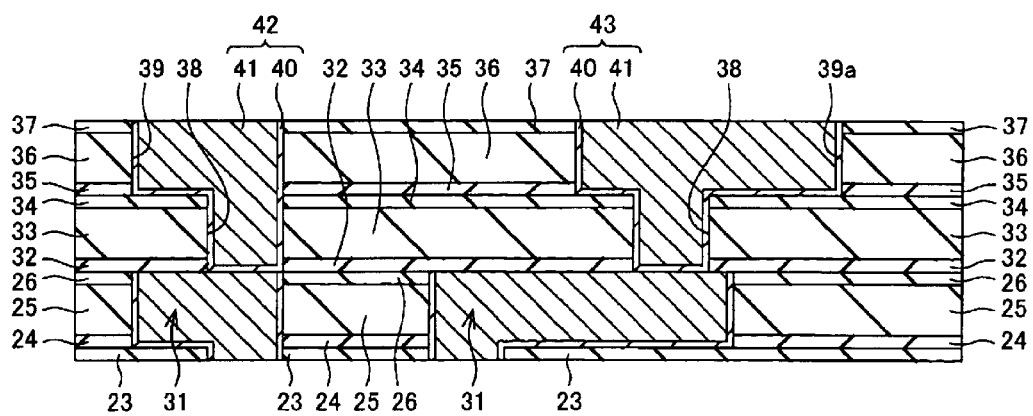
FIG. 10 is a sectional view showing the substantial part of the semiconductor device in a manufacturing step next to the step shown in FIG. 9.

Then, a conductive barrier film 40 of the same material as the conductive barrier film 18 is formed on the insulation film 37 including the bottom and side faces of the holes 38 and 39 in a similar way. Then, a main conductor film 41 of the same material as the main conductor film 19 is formed on the conductive barrier film 40 in a similar way so as to fill the holes 38 and 39. As in the case of the interconnect 31, the main conductor film 41 and the conductive barrier film 40 are polished, for example, by a CMP process until the top face of the insulation film 37 is exposed. Unwanted areas of the conductive barrier film 40 and main conductor film 41 on the insulation film 37 are thus removed, leaving some of the conductive barrier film 40 and main conductor film 41 inside the holes 38 and 39. As a consequence, an interconnect (third interconnect layer) 42 which consists of a relatively thin conductive barrier film 40 and a relatively thick main conductor film 41 is formed inside the holes 38 and 39, as illustrated in FIG. 10. The interconnect area composed of the conductive barrier film 40 and main conductor film 41 buried in the hole 39 is electrically connected through a via hole composed of the conductive barrier film 40 and main conductor film 41 buried in the hole 38 to the interconnect 31 (underlying interconnect layer). The conductive barrier film 40 and main conductor film 41 buried in the hole 39a made in an area for a capacitor, among the holes 39 made in the insulation films 35 to 37, constitute a bottom electrode 43 of the capacitor.

Then, as illustrated in FIG. 11, an insulation film (barrier insulation film) 44 is formed on the insulation film 37 in a way to cover the interconnect 42 and the bottom electrode 43. The insulation film 44 is made of the same material as the insulation film 21: for example, silicon nitride ($Si_xN_y$), silicon carbide (SiC), silicon carbonitride (SiCN), silicon oxynitride (SiON), or silicon oxycarbide (SiOC). The insulation film 44 suppresses or prevents diffusion of the copper in the main conductor film 41 of the interconnect 42 in an insulation film 45 which will be formed later. The insulation film 44 also functions as a capacity insulation film for a capacitor to be formed. The silicon oxycarbide (SiOC) for the insulation film 44 is silicon carbide (SiC) with added oxygen (O). The silicon oxynitride for the insulation film 44 may be exemplified by PE-TMS (made by Canon; dielectric constant=3.9).

An insulation film 45 is formed on the insulation film 44. It is desirable that the insulation film 45 be made of the same material as the insulation film 15, namely a material with a low dielectric constant (low-k material). Then an insulation film 46 is formed on the insulation film 45. The insulation film 46 is made of the same material as the insulation film 16: for example, silicon oxide or silicon oxynitride (SiON). The insulation film 46 maintains the mechanical strength of the insulation film 45, protects its surface and guarantees its moisture resistance during a CMP process.

If the insulation film 46 is formed using oxidizing plasma such as oxygen plasma and the insulation film 45 is made of a material which could be damaged by oxygen plasma, such as an organic polymer material (for example, SiLK) or a porous organic material (for example, PolyELK), a thin insulation film (not shown), like a silicon nitride ($Si_xN_y$) film, a silicon carbide (SiC) film, or a silicon carbonitride (SiCN) film, may be formed on the insulation film 45 without using oxidizing plasma like oxygen plasma to form an insulation film 46 on the thin insulation film. This will improve the degree of adhesion between the insulation film 45 and the insulation film 46. It is also possible to use an insulation film made of silicon nitride ($Si_xN_y$), silicon carbide (SiC) or silicon carbonitride (SiCN) as the insulation film 46.

For reduction in parasitic capacitance of the interconnects, it is desirable that the insulation film 45 be made of a low-k material as mentioned above. However, if the parasitic capacitance is negligible, it is possible to use a silicon oxide film formed by CVD as the insulation film 45. In this case, the insulation film 46 may be omitted.

Next, as illustrated in FIG. 12, a hole 47 is made in a region (above the bottom electrode 43) where the capacitor top electrode is to be formed, by removing selected areas of the insulation films 46 and 45 using the photolithography method and dry etching method. After making the hole 47, the photoresist pattern used as an etching mask (not shown) (and the antireflective coating) is removed by ashing or a similar technique. If the insulation film 45 is made of a material which could be damaged by oxygen plasma, such as an organic polymer material (for example, SiLK) or a porous organic material (for example, PolyELK), the insulation film 45 may be etched by reducing plasma treatment such as $NH_3$ plasma treatment or $N_2/H_2$ plasma treatment and the photoresist pattern (and the antireflective coating) may be removed by ashing. Low pressure low temperature $O_2$ ashing may be used instead of reducing plasma treatment.

In the etching process of making the hole 47, the insulation film 44 is left intact at the bottom of the hole 47. The insulation film remaining at the bottom of the hole 47 functions as a capacity insulation film (dielectric film) for the capacitor. Therefore, in this embodiment, the insulation film 44 can be used as a barrier insulation film (copper anti-diffusion film) for the copper interconnect and also as a capacity insulation film (dielectric film) for the capacitor. As stated above, materials for the insulation film 44 include silicon nitride ($Si_xN_y$), silicon carbide (SiC), silicon carbonitride (SiCN), silicon oxynitride (SiON) and silicon oxycarbide (SiOC). In order to reduce capacitor leak current, it is desirable to use silicon carbonitride (SiCN) or silicon oxynitride (SiON) more desirably silicon oxynitride (SiON). Hence, this not only enables the insulation film 44 to function as a barrier insulation film for the copper interconnect but also realizes a capacitor with minimized current leakage.

Next, a relatively thin conductive barrier film 48 made of the same material as the conductive barrier film 18 (for example, titanium nitride) is made all over the main surface of the semiconductor substrate 1 (namely on the insulation film 46 including the bottom and side walls of the hole 47) in the same way as for the conductive barrier film 18 (for example, sputtering). Then, a main conductor film 49 made of the same material as the main conductor film 19 (for example, copper or copper alloy) is formed on the conductive barrier film 48 in the same way as for the main conductor film 19 (for example, CVD, sputtering or electroplating). Then, as in the case of the interconnect 20, the main conductor film 49 and the conductive barrier film 48 are polished, for example, by the CMP technique until the top face of the insulation film 46 is exposed. Unwanted areas of the conductive barrier film 48 and main conductor film 49 on the insulation film 46 are thus removed, leaving some of the conductive barrier film 48 and main conductor film 49 inside the hole 47. As a consequence, a top electrode 50 of the capacitor which consists of a relatively thin conductive barrier film 48 and a relatively thick main conductor film 49 is formed inside the hole 47, as illustrated in FIGS. 13 and 14. Thus, the top electrode 50 can be formed on the insulation film (interlayer insulation film) 45 as a via forming layer (and the insulation film 46) by a damascene (single damascene) process. The bottom electrode 43, insulation film 44 and top electrode 50 make up an MIM (Metal Insulator Metal) capacitor.

Next, reducing plasma treatment is done to reduce the copper oxide (CuO, $Cu_2O$, $CuO_2$) on the surface of the top electrode 50 as oxidized by CMP to copper (Cu) and form a copper nitride layer on the surface (very thin area) of the top electrode 50.

Then, after cleaning is done as necessary, an insulation film (barrier insulation film) 51 is formed all over the main surface of the semiconductor substrate 1 (namely on the insulation film 46 including the top face of the top electrode 50), as illustrated in FIG. 15. The insulation film 51 is made of, for example, silicon oxynitride (SiON). Other materials for the insulation film 51 include silicon nitride ($Si_xN_y$), silicon carbide (SiC), silicon oxycarbide (SiOC), and silicon carbonitride (SiCN). The insulation film 51 also functions as a barrier insulation film which suppresses or prevents diffusion of the copper in the bottom electrode 50. Also, it functions as an etching stopper film for formation of an interconnect hole which will be stated later. The silicon oxycarbide (SiOC) for the insulation film 51 is silicon carbide (SiC) with added oxygen (O).

Subsequently, insulation films 52 and 53 are formed on the insulation film 51 sequentially. It is desirable that the insulation film 52 be made of the same material as the insulation film 45 (insulation film 15), namely a material with a low dielectric constant (low-k material). The insulation film 53 may be made of the same material as the insulation film 46 (insulation film 16): for example, silicon oxide or silicon oxynitride (SiON). The insulation film 53 maintains the mechanical strength of the insulation film 52, protects its surface and guarantees its moisture resistance during a CMP process.

If the insulation film 53 is formed using oxidizing plasma such as oxygen plasma and the insulation film 52 is made of a material which could be damaged by oxygen plasma, such as an organic polymer material (for example, SiLK) or a porous organic material (for example, PolyELK), a thin insulation film (not shown), such as a silicon nitride ($Si_xN_y$) film, a silicon carbide (SiC) film, or a silicon carbonitride (SiCN) film, may be formed on the insulation film 52 without using oxidizing plasma such as oxygen plasma to form an insulation film 53 on the thin insulation film. This will improve the degree of adhesion between the insulation film 52 and the insulation film 53. It is also possible to use an insulation film made of silicon nitride ($Si_xN_y$), silicon carbide (SiC) or silicon carbonitride (SiCN) as the insulation film 53.

For reduction in parasitic capacitance of the interconnects, it is desirable that the insulation film 52 be made of a low-k material as mentioned above. However, if the parasitic capacitance is negligible, it is possible to use a silicon oxide film formed by CVD or a similar technique as the insulation film 52. In this case, the insulation film 53 may be omitted.

A via hole 54 and a hole (interconnect groove) 55 are made in the same manner as for the holes 27 and 28 by a photolithographic process and a dry etching process, as illustrated in FIGS. 16 and 17. The hole 55 is made by removing selected areas of the insulation films 51 to 53 as in making the hole 28. The hole 54 is made by removing selected areas of the insulation films 44 to 46 at the bottom of the hole 55 as in making the hole 27.

Another approach to making the interconnect holes 54 and 55 is as follows. After formation of the insulation film 51, a hole 54 is made in the insulation films 46 and 51 by a photolithographic process and a dry etching process and then insulation films 52 and 53 are formed (this condition corresponds to the condition that the hole 54 is made in the insulation films 46 and 51 in the step of FIG. 15). Then, a hole 55 is made in the insulation films 52 and 53 by a photolithographic process and a dry etching process; the exposed insulation film 45 is removed from the hole 54 of the insulation films 46 and 51 at the bottom of the hole 55 by dry etching, and the insulation film 44 at the bottom of the hole 54 and the insulation film 51 at the bottom of the hole 55 are removed by dry etching, which results in a structure as shown in FIG. 16.

Next, a relatively thin conductive barrier film 56 made of the same material as the conductive barrier film 18 (for example, titanium nitride) is formed all over the main surface of the semiconductor substrate 1 (namely on the insulation film 53 including the bottoms and side walls of the holes 54 and 55) in the same way as for the conductive barrier film 18 (for example, sputtering). Then, a main conductor film 57 made of the same material as the main conductor film 19 (for example, copper or copper alloy) is made on the conductive barrier film 56 in the same way as for the main conductor film 19 (for example, CVD, sputtering or electroplating). Then, as in the case of the interconnect 20, the main conductor film 57 and the conductive barrier film 56 are polished, for example, by a CMP process until the top face of the insulation film 53 is exposed. Unwanted areas of the conductive barrier film 56 and main conductor film 57 on the insulation film 53 are thus removed, leaving some of the conductive barrier film 56 and main conductor film 57 inside the holes 54 and 55. As a consequence, an interconnect (fourth interconnect layer) 58 which consists of a relatively thin conductive barrier film 56 and a relatively thick main conductor film 57 are formed inside the holes 54 and 55, as illustrated in FIGS. 18 and 19. The interconnect area composed of the conductive barrier film 56 and main conductor film 57 buried in the hole 55 is electrically connected through a via hole composed of the conductive barrier film 56 and main conductor film 57 buried in the hole 54 to the interconnect 42 (underlying interconnect layer).

In the hole 55 made in the insulation films 51 to 53, the conductive barrier film 56 and main conductor film 57 buried in the hole 55a made in a region including at least some part of the top electrode 50 constitute a conductor area (capacitor top electrode lead conductor area) for connection of the capacitor top electrode 50. Since the hole 55a is formed in a way to expose at least part of the top face of the top electrode 50 at its bottom, the conductor area 59 is electrically connected with the top electrode 50 at the bottom of the hole 55a. The pattern of the conductor area 59 may be as desired as far as the top electrode 50 and the conductor area 59 are electrically connected with each other, namely the pattern of the conductor area 59 (hole 55a) and that of the top electrode 50 (hole 47) at least partially overlap each other. Therefore, as illustrated in FIGS. 18 and 19, the conductor area 59 may be patterned so as to cover only some part of the top electrode 50. Alternatively, it may be patterned so as to cover the whole surface of the top electrode 50 though not shown here.

In addition, an insulation film (barrier insulation film) made of the same material as the insulation film 21 is formed on the insulation film 53 where the interconnect 58 and the conductor area 59 are buried, and when necessary, a further overlying interconnect is made, though they are not shown and described here.

In this embodiment, the bottom electrode 43 of the capacitor is formed in the same process as for the buried copper interconnect (interconnect 42) using a damascene technique. Before making a buried copper interconnect (interconnect 58) above it, the top electrode 50 of the capacitor is formed on the insulation film (interlayer insulation film) where a via hole is made, using a damascene (single damascene) technique. Here, the barrier insulation film (insulation film 44) for the buried copper interconnect (interconnect 42) is used as a capacity insulation film (dielectric film) for the capacitor. After this, an insulation film (interlayer insulation film) for formation of an interconnect is formed and an overlying buried copper interconnect (interconnect 58) is formed using a damascene (dual damascene) technique. Here, the lead conductor area 59 for connection of the top electrode 50 of the capacitor can be formed by the same process.

When the top electrode 50 of the capacitor is formed by the same process as for the interconnect 58 (overlying buried copper interconnect), the insulation film 44 should be removed at the bottom of the via (hole 54) for the interconnect 58 (overlying buried copper interconnect) in the same etching process, at the same time leaving some of the insulation film 44 at the bottom of the hole 47 for formation of the top electrode 50 of the capacitor. It is very difficult to achieve this. In order to achieve this, a photoresist mask pattern must be formed on the semiconductor substrate 1 so as to cover the area for formation of the top electrode 50 and expose the other area for formation of the interconnect 58 (particularly via formation area). In order to make such a photoresist mask pattern, it is necessary to make an antireflective coating and a photoresist film all over the surface of the semiconductor substrate 1 and then pattern the photoresist film by photolithography. Before removing the insulation film 44 at the bottom of the via (hole 54) for formation of an interconnect, the antireflective coating buried in the via (hole 54) must be removed. Since the diameter of the via (hole 54) is relatively small, it is not easy to remove the antireflective coating buried in the via hole. If an excessive force should be applied to remove it, the side walls of the via hole could be etched away, causing a deterioration in the reliability of the resulting interconnect and semiconductor device.

In this embodiment, the bottom electrode 43 of the capacitor is formed in the same process as for the interconnect 42, but the interconnect 58 is formed after the top electrode 50 is formed first. Thus, in the process of making a hole 47 for formation of the top electrode 50 of the capacitor, the insulation film 44 functions as an etching stopper film, which makes it easy for some part of the insulation film 44 to remain at the bottom of the hole 47. Later, when removing the insulation film at the bottom of the via (hole 54) for formation of an interconnect, all the exposed insulation film 44 at the bottom of the hole can be removed. This means that it is unnecessary to form an antireflective coating and a photoresist film (which could not be easily removed) to fill the via (hole 54) and it is easy to expose the underlying interconnect (interconnect 42) at the bottom of the via (hole 54). Therefore, the via hole can be made accurately in accordance with the design, thereby increasing the reliability of the resulting interconnect and semiconductor device.

In addition, since the insulation film 44 remains in place at the bottom of the hole 47 for formation of the top electrode 50 of the capacitor and is used as a capacity insulation film (dielectric film) for the capacitor, the number of steps in the semiconductor device manufacturing process can be reduced, leading to a lower cost in the manufacture of a semiconductor device.

Furthermore, since it is possible to make up a capacitor (MIM capacitor) in the buried interconnect structure, the design can be easily modified (for example, addition of a capacitor). For example, while a semiconductor device formed on the semiconductor substrate 1 such as a MISFET remains unchanged, a capacitor can be formed in an interlayer insulation film constituting a buried interconnect according to this embodiment. A damascene process can be used to make up a capacitor, so the design can be modified easily, for example, by changing the exposure mask pattern, which prevents an increase in the semiconductor device manufacturing cost.

Also, according to this embodiment, a capacitor can be formed in any layer of the multilayer interconnect structure. If a capacitor is formed in an upper interconnect layer where the spacing between interconnects is relatively wide (for example, the bottom electrode 43 of the capacitor is formed in the same layer as the third interconnect layer (interconnect 42) in this case), a capacitor can be easily formed in a vacant space where there is no interconnect, so that a more compact semiconductor device can be easily realized.

Also, according to this embodiment, the capacitor (MIM capacitor) lies above the device isolation region 2 (top). This permits reduction in signal cross-talk noise. If the influence of parasitic capacitance is negligible, a semiconductor device (for example, MISFET) can be made below the capacitor (MIM capacitor), so that a more compact semiconductor device can be realized.

(Embodiment 2)

FIGS. 20 to 25 are sectional views showing the substantial part of a semiconductor device in a manufacturing step according to a second embodiment of the present invention. The second embodiment uses the same manufacturing steps as those shown in FIGS. 1 to 11, so descriptions of those steps are omitted here. Steps subsequent to the step shown in FIG. 11 in the second embodiment will be described next. In order to simplify illustration, the layers below the insulation film 23 shown in FIG. 7 are not shown in FIGS. 20 to 25.

Figure 20:
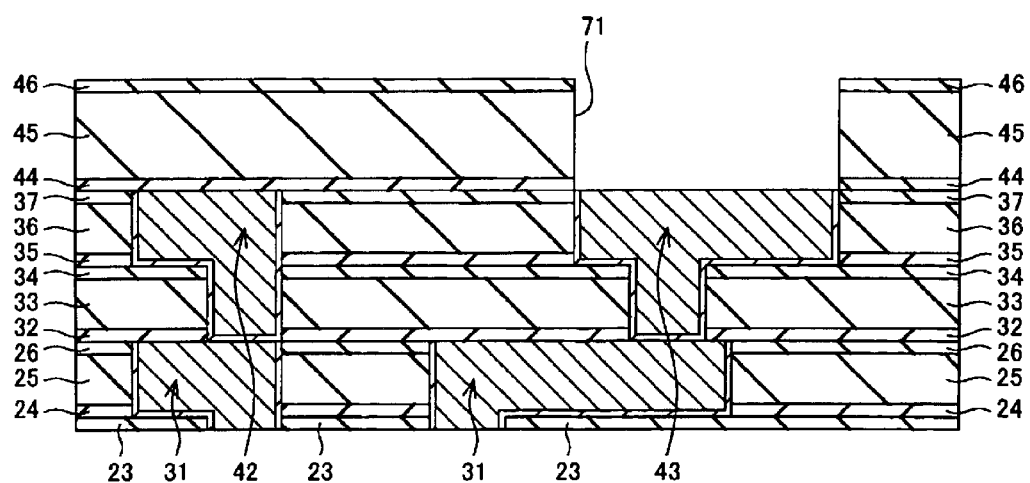
FIG. 20 is a sectional view showing the substantial part of a semiconductor device in a manufacturing step according to another embodiment of the present invention.

After the structure shown in FIG. 11 is obtained, selected areas of the insulation films 46, 45, and 44 are removed by a photolithographic process and a dry etching process to make a hole 71 in a region (above the bottom electrode 43) where the capacitor top electrode is to be formed, as illustrated in FIG. 20. The hole 71 corresponds to the hole 47 in the first embodiment. The difference is that in this embodiment, the insulation film 44 is removed at the bottom of the hole 71. Therefore, the top face of the bottom electrode 43 is exposed at the bottom of the hole 71. If the insulation film 45 is made of a material which could be damaged by oxygen plasma, such as an organic polymer material (for example, SiLK) or a porous organic material (for example, PolyELK), the insulation film 45 may be etched by reducing plasma treatment such as $NH_3$ plasma treatment or $N_2/H_2$ plasma treatment to ash the photoresist pattern and then dry-etch away the insulation film 44 using the insulation film 46 as a hard mask. In this case, the insulation film 46 can be prevented from chipping away due to etching, by forming an insulation film of the same material as the insulation film 44 on the insulation film 46.

Figure 21:
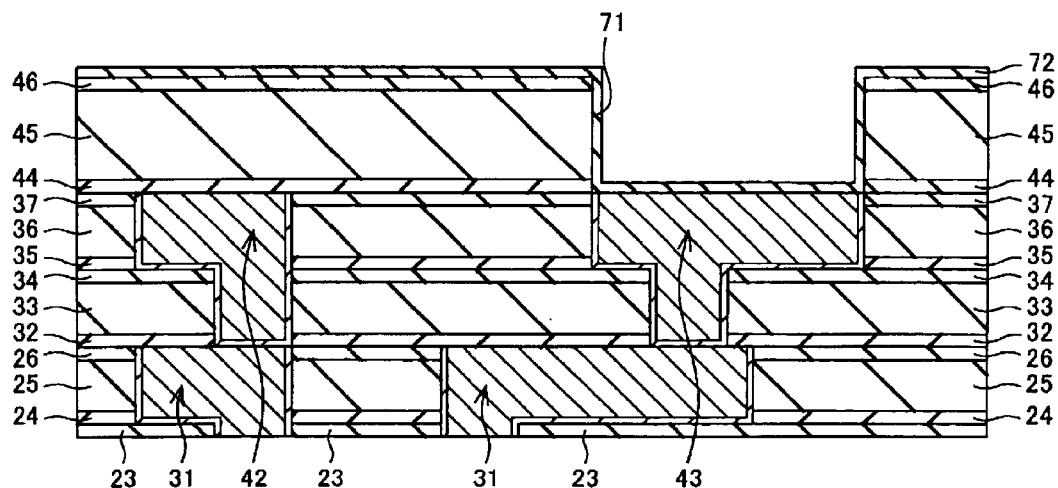
FIG. 21 is a sectional view showing the substantial part of the semiconductor device in a manufacturing step next to the step shown in FIG. 20.

Next, an insulation film 72 is formed all over the semiconductor substrate 1, namely on the insulation film 46 including the bottom and side walls of the hole 71, as illustrated in FIG. 21. The insulation film 72 is made of, for example, silicon nitride ($Si_xN_y$). Other materials for the insulation film 72 include silicon carbide (SiC), silicon carbonitride (SiCN), silicon oxycarbide (SiOC), and silicon oxynitride (SiON). The insulation film 72 also functions as a capacity insulation film (dielectric film) for a capacitor which will be formed later. The silicon oxycarbide (SiOC) for the insulation film 72 is silicon carbide (SiC) with added oxygen (O). In order to reduce capacitor leak current, it is more desirable to use silicon carbonitride (SiCN) or silicon oxynitride (SiON).

Figure 22:
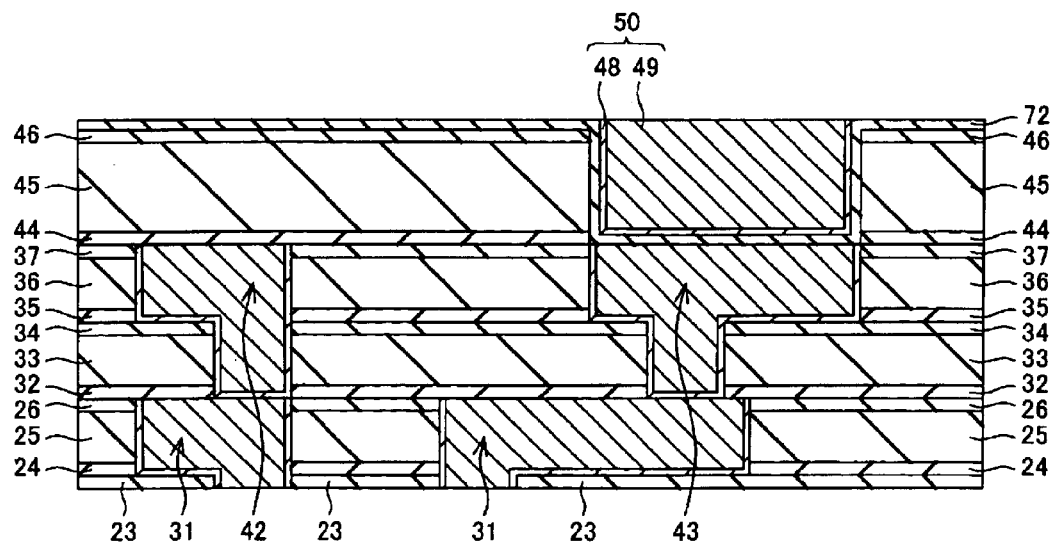
FIG. 22 is a sectional view showing the substantial part of the semiconductor device in a manufacturing step next to the step shown in FIG. 21.
Figure 23:
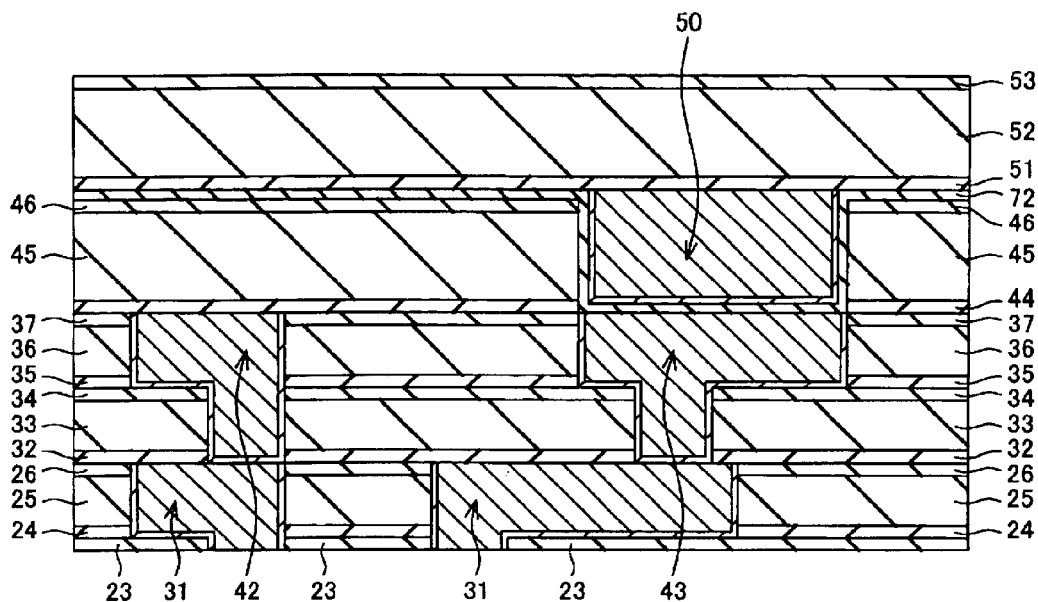
FIG. 23 is a sectional view showing the substantial part of the semiconductor device in a manufacturing step next to the step shown in FIG. 22.

Next, a conductive barrier film 48 is formed all over the main surface of the semiconductor substrate 1 (namely on the insulation film 72). Then, a main conductor film 49 is formed on the conductive barrier film 48. The main conductor film 49 and the conductive barrier film 48 are polished by a CMP process until the top face of the insulation film 72 is exposed. Thus, a capacitor top electrode 50 which consists of the conductive barrier film 48 and main conductor film 49 is formed inside the hole 47, as illustrated in FIG. 22. In this CMP process, the insulation film 72 above the top face of the insulation film 46 may be removed to expose the insulation film 46. The bottom electrode 43, insulation film 72 and top electrode 50 make up an MIM capacitor.

Then, after reducing plasma treatment or cleaning is done as necessary, an insulation film 51 is formed all over the main surface of the semiconductor substrate 1 (namely on the insulation film 72 including the top face of the top electrode 50).

Figure 24:
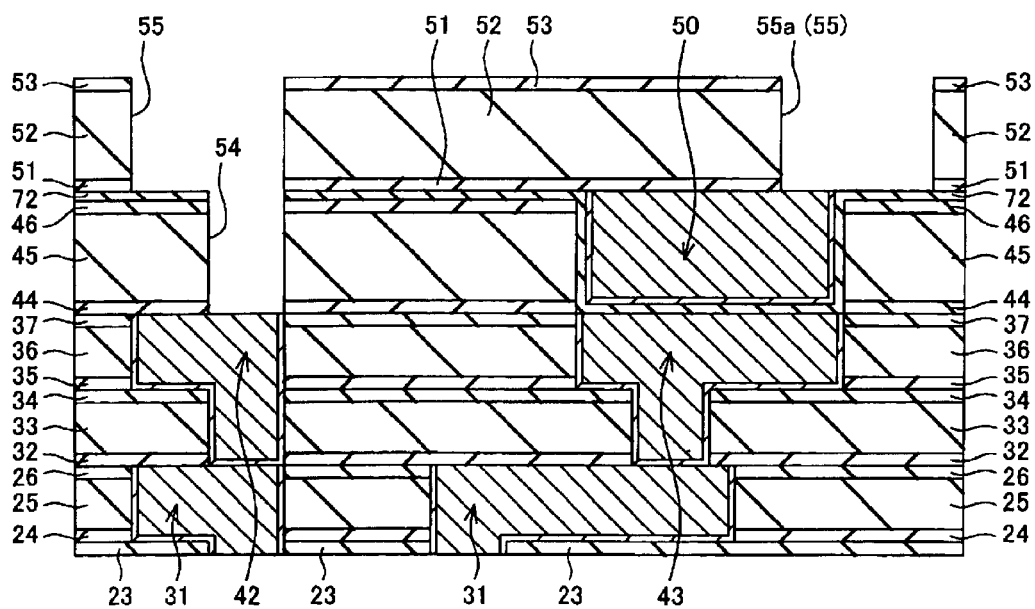
FIG. 24 is a sectional view showing the substantial part of the semiconductor device in a manufacturing step next to the step shown in FIG. 23.
Figure 25:
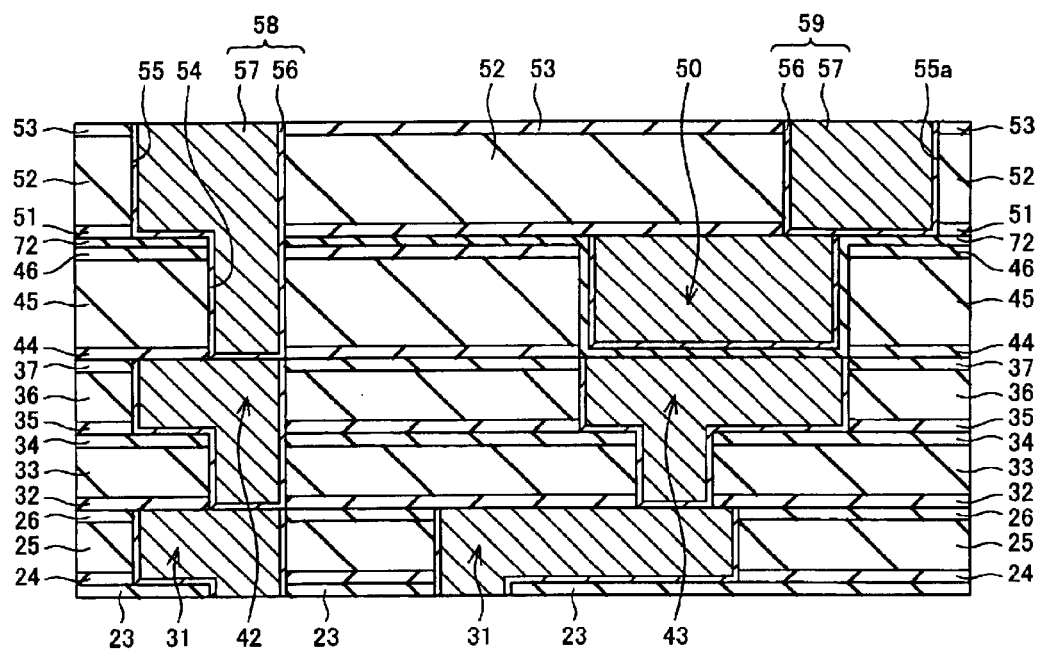
FIG. 25 is a sectional view showing the substantial part of the semiconductor device in a manufacturing step next to the step shown in FIG. 24.

The subsequent steps are almost the same as in the first embodiment. Specifically, an insulation film 52 and an insulation film 53 are formed on the insulation film 51. As illustrated in FIG. 24, a hole (via) 54 and a hole (interconnect groove) 55 are made by a photolithographic process and a dry etching process. The hole 55 is made by removing selected areas of the insulation films 51 to 53. The hole 54 is made by removing selected areas of the insulation films 44 to 46 and 72 at the bottom of the hole 55. As illustrated in FIG. 25, a conductive barrier film 56 and a main conductor film 57 are formed in a way to fill the holes 54 and 55 and a conductor area 59 is formed for connection of the interconnect 58 and the capacitor top electrode 50, by polishing them using a CMP process.

In this embodiment, at the bottom of the hole 71 for formation of the capacitor top electrode 50, the insulation film 44 is removed and the insulation film 72 is formed as a capacity insulation film (dielectric film) for the capacitor. Therefore, the insulation film 72, which is clean because it is not damaged, can be used as the capacity insulation film (dielectric film) so that the reliability and performance of the resulting capacitor can be very high.

(Embodiment 3)

FIGS. 26 to 34 are sectional or top views showing the substantial part of a semiconductor device in a manufacturing step according to a third embodiment of the present invention. The third embodiment uses the same manufacturing steps as those shown in FIGS. 1 to 11, so descriptions of those steps are omitted here. Steps subsequent to the step shown in FIG. 11 in the third embodiment will be described next. FIGS. 27, 29, 32, and 34 are top views respectively showing the substantial part of the semiconductor device shown in FIGS. 26, 28, 31, and 33. FIGS. 26, 28, 31, and 33 are sectional views taken along the line A—A of FIGS. 27, 29, 32, and 34, respectively. Among FIGS. 26 to 34, the figures other than FIGS. 27, 29, 32, and 34 are sectional views. For simpler illustration and better understanding, the structural part located below the insulation film 23 shown in FIG. 7 is not shown in these sectional views.

Figure 26:
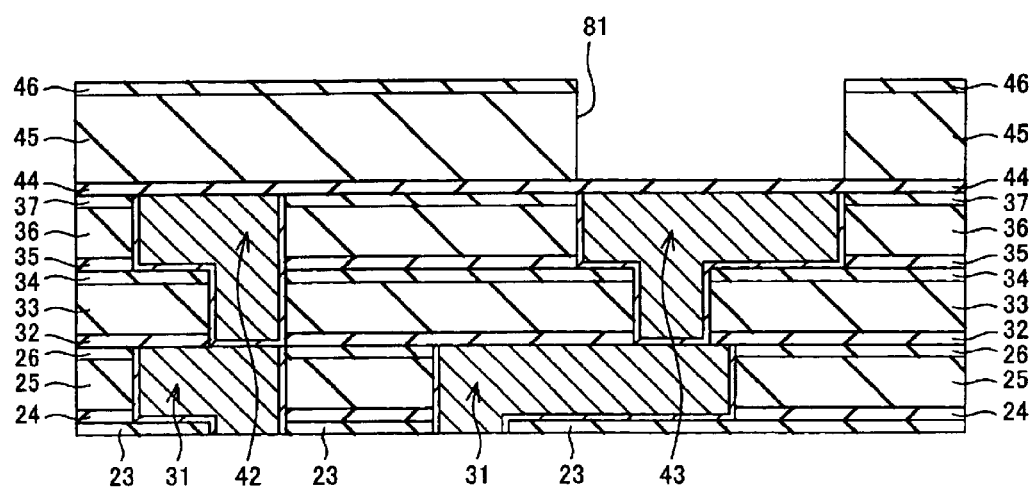
FIG. 26 is a sectional view showing the substantial part of a semiconductor device in a manufacturing step according to another embodiment of the present invention.
Figure 27:
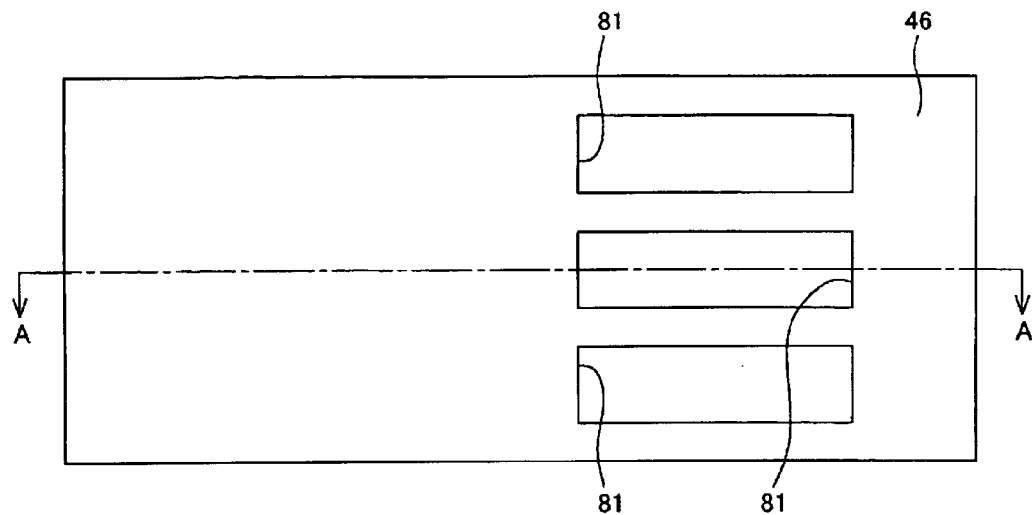
FIG. 27 is a top view showing the substantial part of the semiconductor device shown in FIG. 26.

After the structure shown in FIG. 11 is obtained, selected areas of the insulation films 46 and 45 are removed to make a hole 81 in a region (above the bottom electrode 43) where the capacitor top electrode is to be made, by a photolithographic process and a dry etching process, as illustrated in FIGS. 26 and 27. The hole 81 corresponds to the hole 47 in the first embodiment. The difference is that in this embodiment, a plurality of holes 81 are made above the bottom electrode 43. In the case of FIG. 27, there are three holes 81. However, the number of holes 81 is not limited thereto; any number of holes 81 (2 or more) may be made. The insulation film 44 remains in place at the bottom of each hole 81 and functions as a capacity insulation film (dielectric film) for a capacitor which will be formed later.

Figure 28:
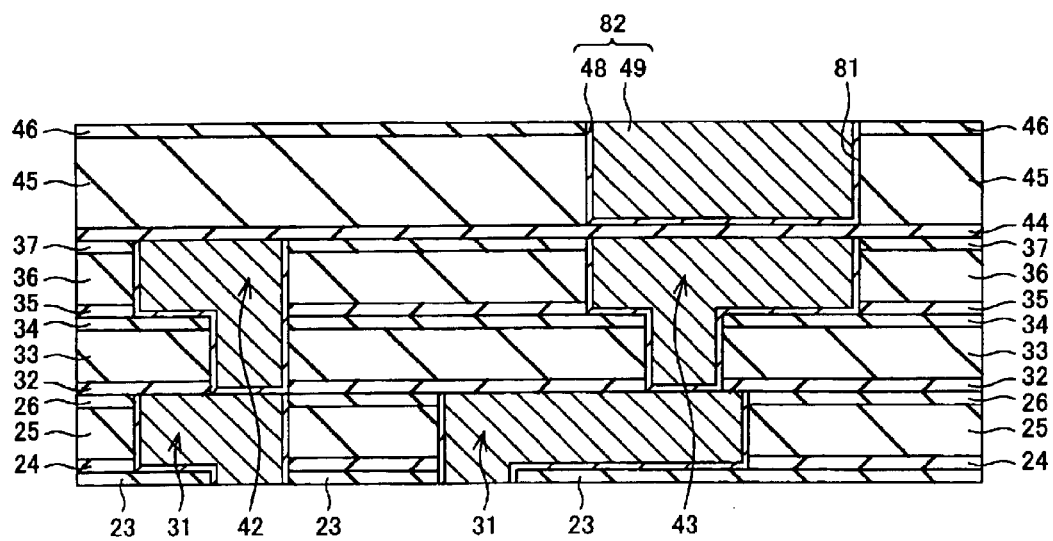
FIG. 28 is a sectional view showing the substantial part of the semiconductor device in a manufacturing step next to the step shown in FIG. 26.
Figure 29:
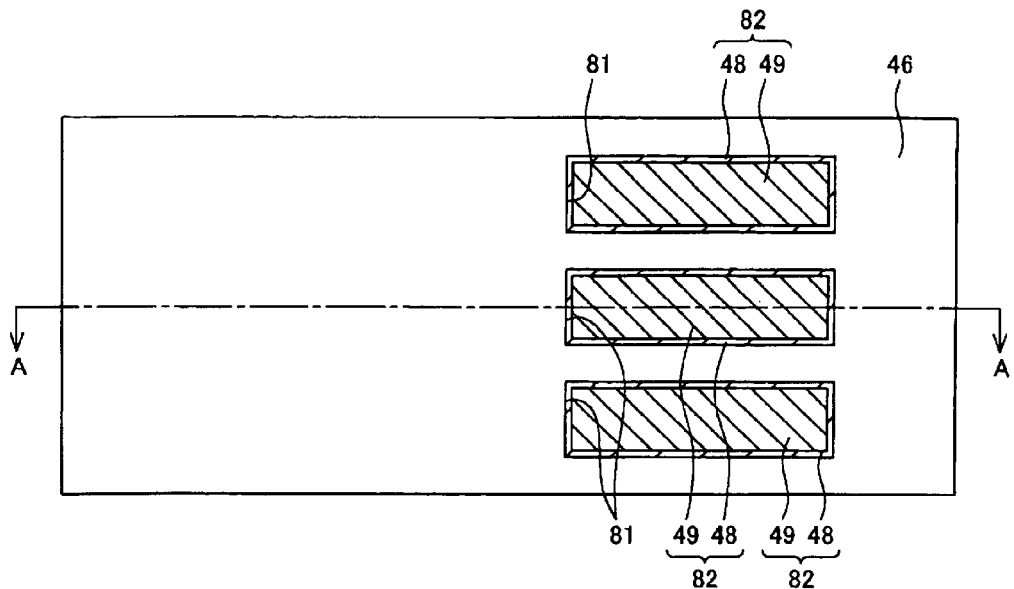
FIG. 29 is a top view showing the substantial part of the semiconductor device shown in FIG. 28.
Figure 30:
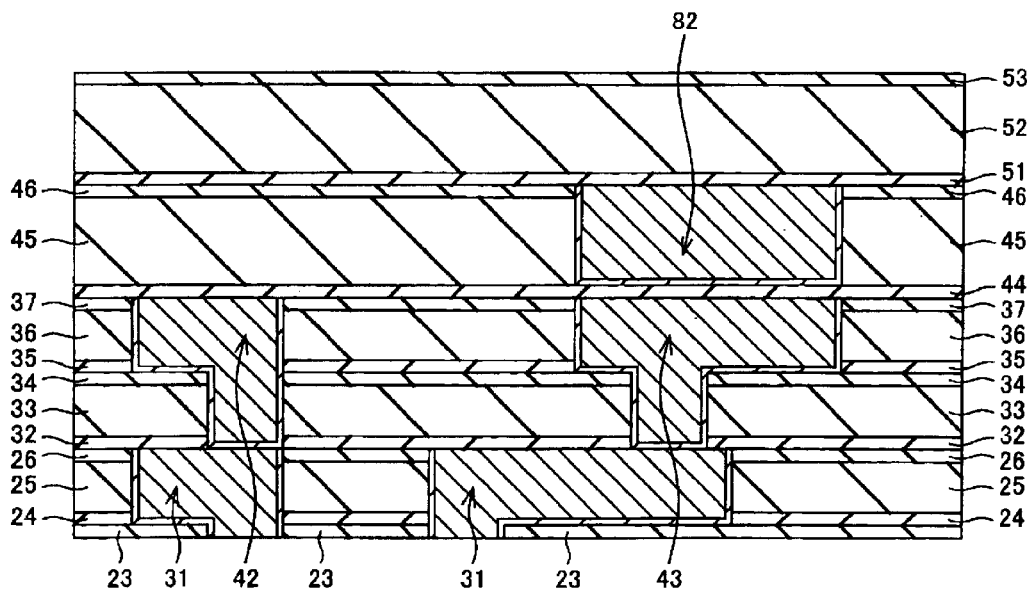
FIG. 30 is a sectional view showing the substantial part of the semiconductor device in a manufacturing step next to the step shown in FIG. 28.

Next, a conductive barrier film 48 is formed all over the main surface of the semiconductor substrate 1 (namely on the insulation film 46 including the bottoms and side walls of the holes 81). Then, a main conductor film 49 is formed on the conductive barrier film 48 in a way to fill the holes 81. After that, as illustrated in FIGS. 28 and 29, the main conductor film 49 and conductive barrier film 48 are polished by a CMP process until the top face of the insulation film 46 is exposed, so that a capacitor top electrode 82 composed of the conductive barrier film 48 and main conductor film 49 is formed inside each hole 81. The bottom electrode 43, insulation film 44 and top electrode 82 constitute an MIM capacitor. Although the top electrodes are not electrically connected with each other at this moment, they will be electrically connected with each other through a conductor area for top electrode connection, which will be stated later.

Figure 31:
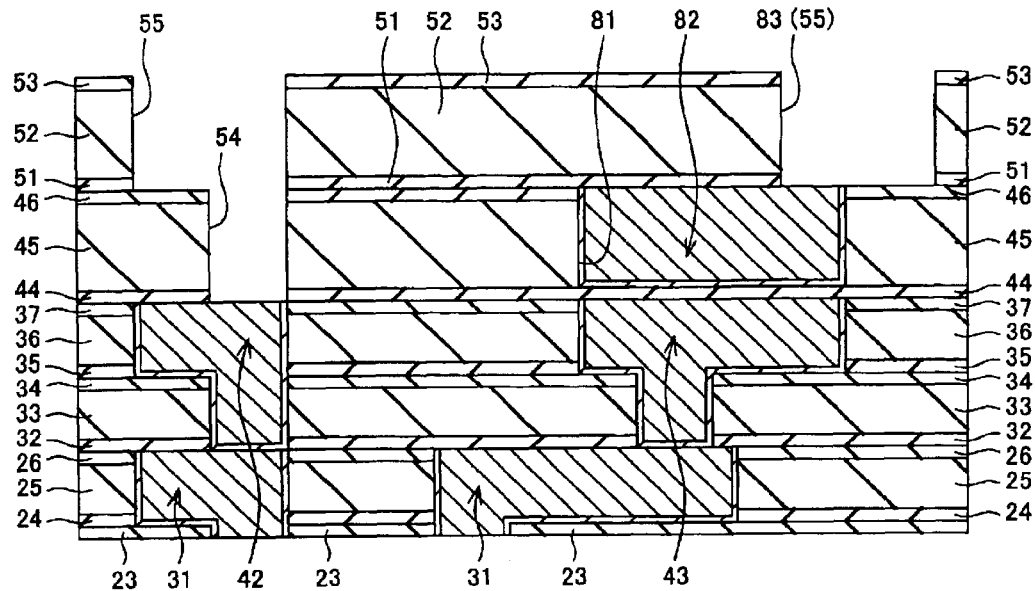
FIG. 31 is a sectional view showing the substantial part of the semiconductor device in a manufacturing step next to the step shown in FIG. 30.
Figure 32:
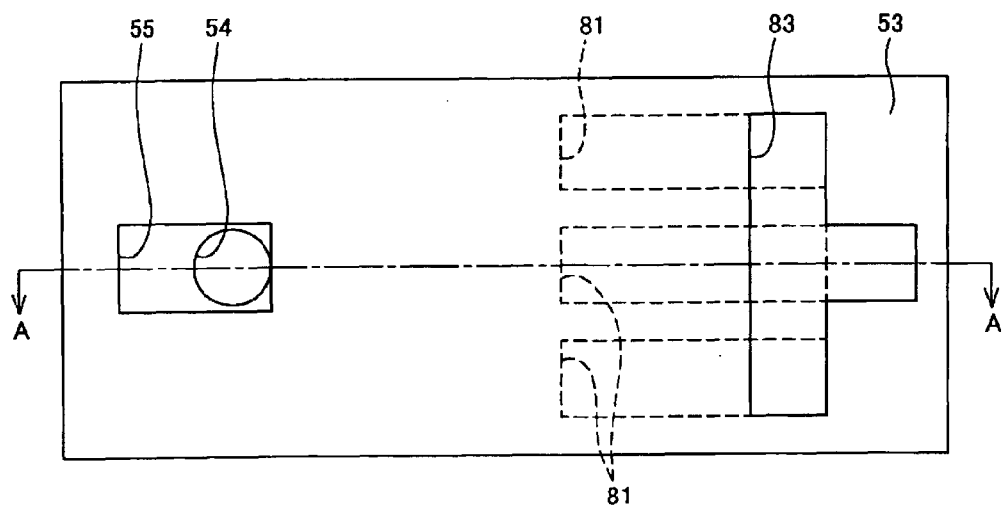
FIG. 32 is a top view showing the substantial part of the semiconductor device shown in FIG. 31.
Figure 33:
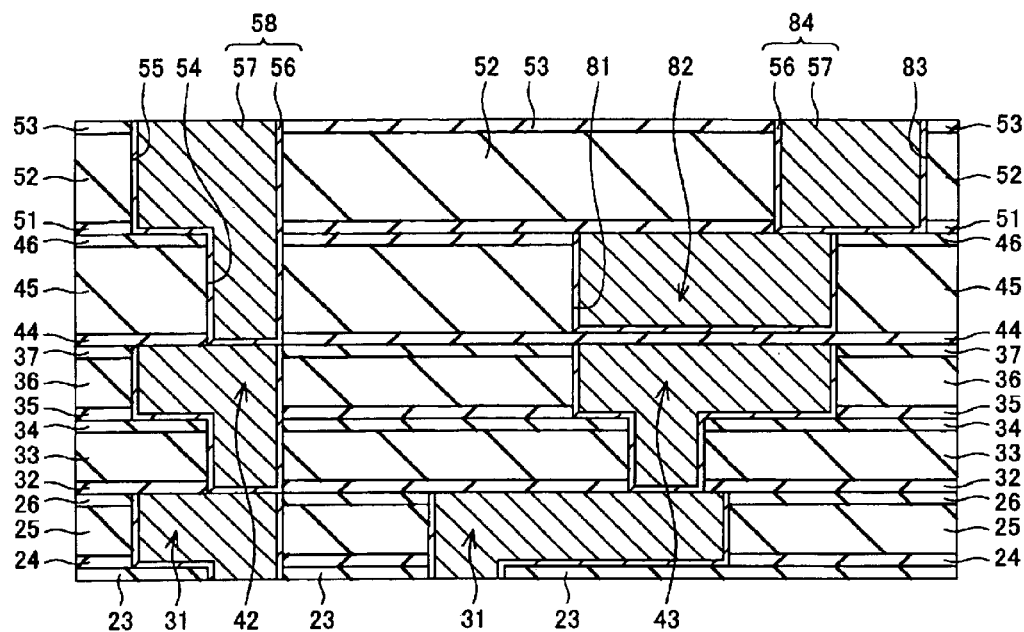
FIG. 33 is a sectional view showing the substantial part of the semiconductor device in a manufacturing step next to the step shown in FIG. 31.
Figure 34:
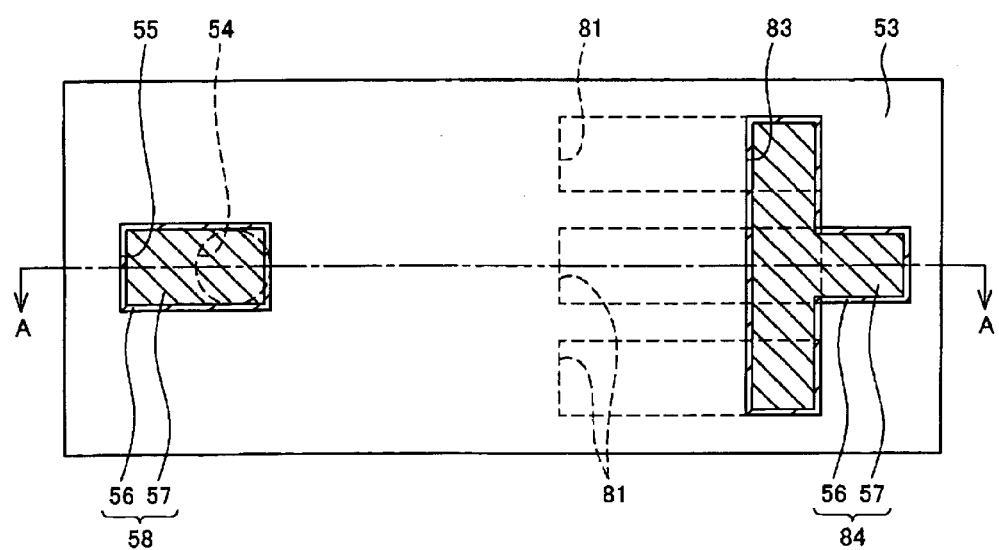
FIG. 34 is a top view showing the substantial part of the semiconductor device shown in FIG. 33.

Then, after reducing plasma treatment or cleaning is done as necessary, insulation films 51, 52, and 53 are formed sequentially all over the main surface of the semiconductor substrate 1 (namely on the insulation film 46 including the top face of the top electrode 50). Like the first embodiment, as illustrated in FIGS. 31 and 32, a hole (via) 54 and a hole (interconnect groove) 55 are made by a photolithographic process and a dry etching process. Then, like the first embodiment, as illustrated in FIGS. 33 and 34, a conductive barrier film 56 and a main conductor film 57 are formed in a way to fill the holes 54 and 55, and an interconnect 58 is formed inside the holes 54 and 55 by polishing them using a CMP process. In the hole 55 made in the insulation films 51 to 53, the conductive barrier film 56 and main conductor film 57 buried in the hole 83 (which corresponds to the hole 55a in the first embodiment) made in a region including at least some part of the top electrodes 82 constitute a conductor area (capacitor top electrode lead conductor area) for connection of the capacitor top electrodes 82. The hole 83 is formed in a way to expose the top electrodes 82 at its bottom. Therefore, the conductor area 84 has a function to electrically connect the top electrodes 82. As a consequence, MIM capacitors, each composed of a bottom electrode 43, a capacitor insulation film 44 and a top electrode 82, are connected in parallel through the conductor area 84, thus making up an overall capacitor (MIM capacitor).

In this embodiment, the holes 81 for formation of the top electrodes 82 are relatively small. Since each hole 81 need not be so large, the number of holes 81 can be increased to create a larger capacity capacitor. Therefore, in the CMP process after the conductive barrier film 57 and main conductor film 58 are buried in the holes 81, dishing or erosion in the holes 81 is prevented. Consequently, it is easier to make a relatively large capacity capacitor. Also, capacitors with different capacities can be created without causing such a problem as dishing, for example, by adjusting the number of holes 81 of a size.

Like the second embodiment, it is also possible to remove the insulation film 44 at the bottom of each hole 81 and form an insulation film 72 as a capacitor insulation film on the insulation film 46 including the bottom and side walls of each hole 81.

Preferred embodiments of the present invention have been concretely described so far. However, the present invention is not limited to the above embodiments and may be embodied in any other form without departing from the spirit and scope thereof.

Although the above embodiments concern a semiconductor device which has an MIM capacitor and a MISFET, the present invention is not limited thereto. The invention may be applied to various semiconductor devices which have interconnects including copper-based main conductor films.

What is claimed is:

1. A semiconductor device manufacturing method comprising the steps of:
    (a) preparing a semiconductor substrate;
    (b) forming, on said semiconductor substrate, a first insulation film where a first interconnect with a copper-based first conductor film and a capacitor bottom electrode are buried;
    (c) forming a second insulation film on said first insulation film where said first interconnect and said bottom electrode are buried;
    (d) forming a third insulation film on said second insulation film;
    (e) forming a first hole by removing a selected area of said third insulation film;
    (f) forming a capacitor top electrode with a second conductor film in said first hole;
    (g) forming a fourth insulation film on said third insulation film where said top electrode is buried;
    (h) forming a second hole and a third hole to expose said top electrode by removing a selected area of said fourth insulation film, and forming a fourth hole to expose said first interconnect by removing selected areas of said third insulation film and said second insulation film at the bottom of said second hole; and
    (i) filling a copper-based third conductor film into said second hole, said third hole, and said fourth hole.

2. The semiconductor device manufacturing method according to claim 1, wherein said second insulation film suppresses or prevents diffusion of copper.

3. The semiconductor device manufacturing method according to claim 1, wherein said second insulation film lying between said bottom electrode and said top electrode functions as a capacity insulation film for a capacitor.

4. The semiconductor device manufacturing method according to claim 1, wherein, at said step (e), a first hole is made by removing selected areas of said third insulation film and said second insulation film,
    after said step (e) and before said step (f), further comprising the step of:
    (e1) forming a fifth insulation film on said third insulation film including the bottom and side walls of said first hole.

5. The semiconductor device manufacturing method according to claim 4, wherein said fifth insulation film lying between said bottom electrode and said top electrode functions as a capacity insulation film for said capacitor.

6. The semiconductor device manufacturing method according to claim 1, wherein:
    at said step (e), a plurality of said first holes are made;
    at said step (f), said top electrode is formed in each of said plural first holes; and
    at said step (h), said third hole exposes said top electrode formed in each of said plural first holes at its bottom.

7. The semiconductor device manufacturing method according to claim 1,
    said step (b) comprising the sub-steps of:
    (b1) forming said first insulation film on said semiconductor substrate;
    (b2) forming a fifth hole and a sixth hole in said first insulation film;
    (b3) forming said copper based first conductor film which fills said fifth hole and said sixth hole; and
    (b4) forming said first interconnect inside said fifth hole and said bottom electrode inside said sixth hole by removing said first conductor film except its part buried in said fifth hole and said sixth hole.

8. The semiconductor device manufacturing method according to claim 1,
    said step (f) comprising the sub-steps of:
    (f1) forming said copper based second conductor film which fills said first hole; and
    (f2) forming said top electrode inside said first hole by removing said second conductor film except its part buried in said first hole.

9. The semiconductor device manufacturing method according to claim 1, after said step (i), further comprising the step of:
    (j) removing said third conductor film except its parts buried in said second hole, said third hole, and said fourth hole.

10. The semiconductor device manufacturing method according to claim 9, wherein at said step (j), said third conductor film buried inside said second hole and said fourth hole constitutes a second interconnect electrically connected with said first interconnect, and said third conductor film buried inside said third hole constitutes a conductor area electrically connected with said top electrode.

* * * * *